(12) United States Patent
Azumi et al.

(10) Patent No.: US 8,134,361 B2
(45) Date of Patent: Mar. 13, 2012

(54) MAGNETIC SENSOR INCLUDING MAGNETIC FIELD DETECTORS AND FIELD RESISTORS ARRANGED ON INCLINED SURFACES

(75) Inventors: Junichi Azumi, Miyagi (JP); Futoyoshi Kou, Miyagi (JP); Akihiro Fuse, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 805 days.

(21) Appl. No.: 12/137,902

(22) Filed: Jun. 12, 2008

(65) Prior Publication Data
US 2009/0015251 A1 Jan. 15, 2009

(30) Foreign Application Priority Data

Jun. 13, 2007 (JP) ................................. 2007-156423
Apr. 17, 2008 (JP) ................................. 2008-108061

(51) Int. Cl.
*G01R 33/09* (2006.01)
(52) U.S. Cl. .................................. 324/252; 324/207.21
(58) Field of Classification Search ............. 324/207.21, 324/207.25, 252
See application file for complete search history.

(56) References Cited

U.S. PATENT DOCUMENTS

| | | | | |
|---|---|---|---|---|
| 4,766,376 A | * | 8/1988 | Takahashi et al. | 324/207.21 |
| 5,359,287 A | * | 10/1994 | Watanabe et al. | 324/207.21 |
| 5,656,936 A | * | 8/1997 | Ao et al. | 324/207.21 |
| 6,020,736 A | * | 2/2000 | Aoyama et al. | 324/207.21 |
| 6,366,079 B1 | * | 4/2002 | Uenoyama | 324/207.21 |
| 6,954,063 B2 | * | 10/2005 | Kinpara et al. | 324/207.21 |

FOREIGN PATENT DOCUMENTS

| | | |
|---|---|---|
| DE | 35 17 095 A1 | 1/1986 |
| DE | 101 45 300 C1 | 10/2002 |
| EP | 1 413 853 A1 | 4/2004 |
| JP | 09219546 A * | 8/1997 |
| JP | 2003-8101 | 1/2003 |
| JP | 3498737 | 12/2003 |
| JP | 2006-10591 | 1/2006 |
| JP | 2006-308573 | 11/2006 |
| WO | WO 2006/098431 A1 | 9/2006 |

OTHER PUBLICATIONS

J. Daughton, et al. "Magnetic Field Sensors Using GMR Multilayer" IEEE Transactions on Magnetics, vol. 30, No. 6, XP 000674135, Nov. 1994, pp. 4608-4610.

* cited by examiner

*Primary Examiner* — Jay Patidar
(74) *Attorney, Agent, or Firm* — Oblon, Spivak, McClelland, Maier & Neustadt, L.L.P.

(57) ABSTRACT

A magnetic sensor including sensor bridge circuits, each including a pair of magnetic field detectors and a pair of fixed resistors. The magnetic field detectors in each bridge circuit are located on the same inclined surface, while the fixed resistors are each located on a different inclined surface. The inclined surface configuration reduces the number of fabrication steps necessary to fabricate the magnetic sensor.

8 Claims, 16 Drawing Sheets

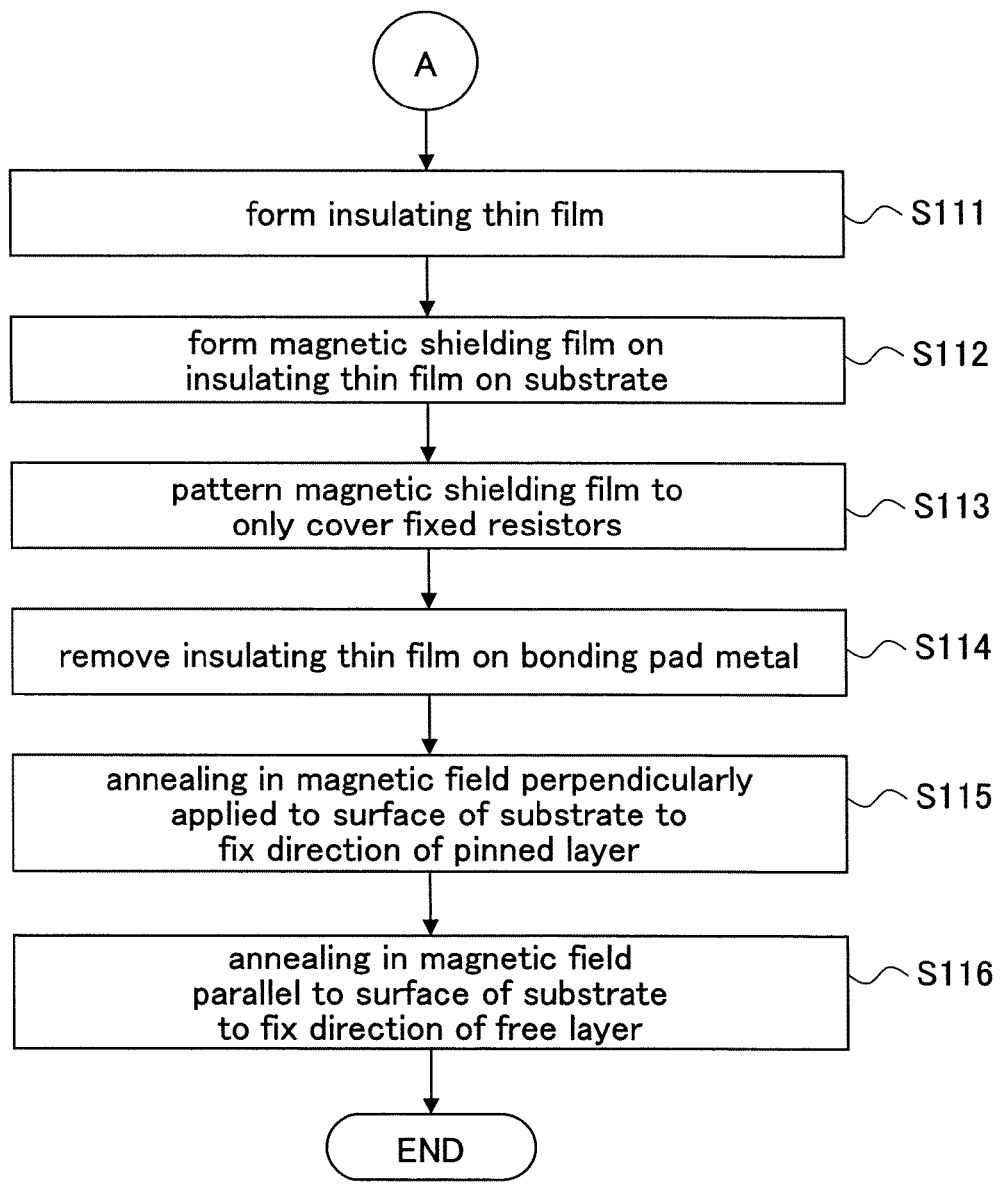

MAGNETIC SENSOR INCLUDING MAGNETIC FIELD DETECTORS AND FIELD RESISTORS ARRANGED ON INCLINED SURFACES

BACKGROUND OF THE INVENTION

1. Field of the Invention

The present invention relates to a magnetic sensor using a magneto-resistance element, and a method of producing the magnetic sensor.

2. Description of the Related Art

In the related art, there are various kinds of sensors having magneto-resistance elements, and such kind of sensors include those using a magneto-resistance effect element (MR element), a magneto-impedance element (MI element), a fluxgate sensor, a semiconductor Hall effect sensor, and others.

For example, consider an MI sensor, since an MI element (a magneto-resistance element) is used, it is easy to make the MI sensor thin and small, and further improvement is being made.

As for an MR element, when a high-frequency current flow in the MR element, a high-frequency impedance of the MR element changes along with a magnetic field, and it is possible to detect the field strength of the magnetic field by utilizing the change of the high-frequency impedance caused by the magnetic field.

A Giant Magneto-Resistive element (GMR element) and a Tunnel Magneto-Resistive (TMR) element are well-known magnetic sensors using magneto-resistance (MR) effect elements.

A GMR element includes ferromagnetic layers and non-ferromagnetic layers stacked alternately, and detects the field strength of the magnetic field by utilizing a varying resistance occurring when the magnetization directions of two neighboring magnetic layers change between a parallel state and an anti-parallel state according to the strength of an external magnetic field.

A TMR element includes magnetic thin films stacked with insulating films in between. In the TMR element, electrons contributing to conduction penetrate the insulating film by a tunneling phenomenon while sustaining their spins; thereby, the tunneling coefficient changes along with the magnetization state in this process. The TMR element detects the field strength of the magnetic field by utilizing varying tunneling coefficients.

Such a magneto-resistance effect element (MR element) has a pinned layer (fixed layer) in which the magnetization direction is fixed in a specified direction, and a free layer in which the magnetization direction changes along with the direction of the external magnetic field. The magnetic sensor detects the direction of the external magnetic field by utilizing the fact that the resistance changes along with a relative relationship between the magnetization direction of the free layer changing along with the direction of the external magnetic field, and the magnetization direction of the pinned layer fixed during detection of the external magnetic field.

In recent years, devices using the GPS (Global Positioning System), such as car navigation devices and mobile phones, have become widely spread. Among these devices, in applications of confirming a current position in an area where electromagnetic waves from satellites of a GPS are shielded, very small magnetic sensors are required. For this purpose, a magnetic sensor formed on a silicon wafer and able to be integrated together with an IC (Integrated Circuit) is quite suitable. In addition, the magnetic sensor is required also in direction detection in a two-dimensional plane or in a three-dimensional space.

For example, Japanese Patent Gazette No. 3498737 (hereinafter, referred to as "reference 1") discloses the magnetic sensor capable of the direction detection in the two-dimensional plane.

The magnetic sensor capable of the direction detection in the three-dimensional space is disclosed in, for example, Japanese Laid Open Patent Application No. 2003-008101 (hereinafter, referred to as "reference 2"), Japanese Laid Open Patent Application No. 2006-010591 (hereinafter, referred to as "reference 3"), and Japanese Laid Open Patent Application No. 2006-308573 (hereinafter, referred to as "reference 4").

In reference 1, magneto-resistance effect elements are arranged in a plane of a substrate to be perpendicular to each other so as to detect changes of a magnetic field along two mutually perpendicular directions (for example, X direction, Y direction). In addition, in each of two directions, plural magneto-resistance effect elements are connected to form a Wheatstone Bridge circuit.

Reference 2 discloses a technique utilizing the TMR elements. In reference 2, one-axis TMR elements, each of which is able to detect variation of a magnetic field along one axis, are independently mounted along three axes perpendicular to each other by using a mounting technique to form a three-axis direction sensor.

In reference 3, a two-axis magnetic field detector and a one-axis magnetic field detector, which are formed from MR elements, are formed on a flexible substrate, and a three-axis direction sensor is obtained by bending the flexible substrate with a thin-film conductive member electrically connected to the two-axis magnetic field detector and the one-axis magnetic field detector.

In reference 4, magneto-resistance effect elements are arranged in a plane of a substrate to be perpendicular to each other so as to detect changes of a magnetic field along two perpendicular directions (for example, X direction, Y direction) further, magneto-resistance effect elements are arranged on an inclined surface formed on a substrate so as to detect changes of the magnetic field along a Z direction. In addition, in each of three directions, plural magneto-resistance effect elements are connected to form a Wheatstone Bridge circuit.

As described above, there are several kinds of three-axis magnetic sensors, such as the three-axis magnetic sensor disclosed in reference 2, which is formed by mounting one-axis magnetic elements in directions along three axes perpendicular to each other, and a three-axis magnetic sensor disclosed in reference 3, which is formed by arranging a two-axis magnetic field detector and a one-axis magnetic field detector on a flexible substrate, and bending the flexible substrate.

However, in the three-axis direction sensor disclosed in reference 2, because of the three-dimensional mounting, it is difficult to improve precision of the perpendicularity of the three axes, interconnection of electric wiring is complicated, and the three-axis direction sensor becomes relatively large.

In the three-axis direction sensor disclosed in reference 3, the precision of the relative positional relation of the magnetization directions of the two-axis magnetic field detectors, specifically, the magnetization directions of the pinned layers (fixed layer) in the axes, can be made very high. On the other hand, the precision of the relative positional relation of the two-axis magnetic field detectors relative to the one-axis magnetic field detector is determined by the way of bending the flexible substrate, and for this reason, the precision of the relative positional relation of the magnetization directions of the two-axis magnetic field detector and the one-axis magnetic field detector is lower than the precision of the relative positional relation of the magnetization directions of the two-axis magnetic field detectors. In addition, in order to bend and fix the flexible substrate, a certain overlap width is required, and this results in a thick and large substrate member for fixing the flexible substrate.

Uncertainty of the precision of the relative position between the three axes results in inclination of the position precision obtained from the measured output of the external magnetic field.

In addition, when installing the three-axis direction sensor in a mobile phone or other devices, small and thin magnetic sensors are required. However, the three-axis direction sensors disclosed in reference 2 and reference 3 have limitations in this aspect.

The direction sensor disclosed in reference 4 is proposed to solve the problems existing in the direction sensors disclosed in references 2, 3.

As described above, a magnetic sensor using a magneto-resistance effect element (MR element) has a pinned layer (fixed layer) in which the magnetization direction is fixed in a specified direction, and a free layer in which the magnetization direction changes along with the direction of the external magnetic field. The magnetic sensor detects the direction of the external magnetic field by utilizing the fact that the resistance changes along with a relative relationship between the magnetization direction of the free layer changing along with the direction of the external magnetic field, and the magnetization direction of the pinned layer fixed during detection of the external magnetic field. Therefore, the magnetization direction of the pinned layer (fixed direction) is different from an optimum direction in a multi-axis direction. The magnetization direction of the pinned layer is determined by thermal treatment at a given temperature in the magnetic field. For this reason, in two-axis or multi-axis sensors on the same substrate, for each axis, the magnetization direction is changed to magnetize the pinned layer (fixed layer), as disclosed in reference 1 and reference 4.

SUMMARY OF THE INVENTION

The present invention may solve one or more problems of the related art.

A preferred embodiment of the present invention may provide a three-axis magnetic sensor arranged on a substrate and able to improve precision of the relative positional relation of three axes of the three-axis magnetic sensor.

A preferred embodiment of the present invention may provide a method of producing the magnetic sensor enabling reference resistors connected to form a bridge circuit to be formed on the same substrate, and enabling simultaneous magnetization of pinned layers of all axes by thermal treatment in a magnetic field having a predetermined direction.

A preferred embodiment of the present invention may provide a magnetic sensor having plural axes at the same time, and a fabrication method enabling the magnetic sensor to be fabricated through a small number of steps.

According to a first aspect of the present invention, there is provided a magnetic sensor, comprising:
a substrate; and
a plurality of sensor bridge circuits each including a pair of magnetic field detectors and a pair of fixed resistors arranged on the substrate, the pair of the magnetic field detectors and the pair of the fixed resistors being connected to form a bridge circuit, each of the magnetic field detectors being formed from a magneto-resistance effect element, the magnetization directions of the magnetic field detectors intersecting with each other in a three-dimensional manner,
wherein
the substrate has a plurality of inclined surfaces, the normal directions of the inclined surfaces intersecting with each other in a three-dimensional manner, and
the pair of the magnetic field detectors in each of the sensor bridge circuits is arranged in the same inclined surface.

Preferably, the substrate is formed from a (100) single crystal silicon wafer, and has a plurality of inclined surfaces of normal directions intersecting with each other in a three-dimensional manner, each of the inclined surfaces being a (111) orientation crystal plane forming an angle of 55 degrees relative to a surface of the substrate, and
the pair of the magnetic field detectors in each of the sensor bridge circuits is arranged in the same inclined surface.

According to a second aspect of the present invention, there is provided a magnetic sensor, comprising:
a substrate; and
a first sensor bridge circuit, a second sensor bridge circuit, and a third sensor bridge circuit, each of the first sensor bridge circuit, the second sensor bridge circuit, and the third sensor bridge circuit including a pair of magnetic field detectors and a pair of reference resistors arranged on the substrate and connected to form a bridge circuit, each of the magnetic field detectors being formed from a magneto-resistance effect element, each of reference resistors having a constant resistance value not influenced by an external magnetic field, the magnetization directions of the magnetic field detectors intersecting with each other in a three-dimensional manner,
wherein
the substrate has a plurality of inclined surfaces, the normal directions of the inclined surfaces intersecting with each other in a three-dimensional manner, and
the magnetic field detectors in each of the first sensor bridge circuit, the second sensor bridge circuit, and the third sensor bridge circuit are arranged in the inclined surfaces having normal directions intersecting with each other in a three-dimensional manner, and
the pair of the magnetic field detectors in the same one of the first sensor bridge circuit, the second sensor bridge circuit, and the third sensor bridge circuit are arranged in the inclined surfaces having the same normal direction.

Preferably, the substrate is formed from a (100) single crystal silicon wafer, and has a plurality of inclined surfaces of normal directions intersecting with each other in a three-dimensional manner, each of the inclined surfaces being a (111) orientation crystal plane forming an angle of 55 degrees relative to a surface of the substrate,
the magnetic field detectors in each of the first sensor bridge circuit, the second sensor bridge circuit, and the third sensor bridge circuit are arranged in the inclined surfaces having normal directions intersecting with each other in a three-dimensional manner, and
the pair of the magnetic field detectors in the same one of the first sensor bridge circuit, the second sensor bridge circuit, and the third sensor bridge circuit is arranged in the inclined surfaces having the same normal direction.

Preferably, each of the fixed resistors includes a magneto-resistance effect element formed from the same layer configuration as the magnetic field detectors, and is covered by a magnetic shielding member with an insulating member of electrical insulation in between.

Preferably, the fixed resistors are arranged on the inclined surfaces formed on the substrate.

Preferably, the magneto-resistance effect element includes a tunnel magneto-resistance effect element.

According to a third aspect of the present invention, there is provided a method of producing a magnetic sensor, comprising the steps of:

preparing a substrate;

forming a plurality of inclined surfaces on the substrate, normal directions of the inclined surfaces intersecting with each other in a three-dimensional manner, arranging a pair of magnetic field detectors in each of a plurality of sensor bridge circuits in the same inclined surface, each of the sensor bridge circuits including the pair of magnetic field detectors and a pair of fixed resistors arranged on the substrate, the pair of the magnetic field detectors and the pair of the fixed resistors being connected to form a bridge circuit, each of the magnetic field detectors being formed from a magneto-resistance effect element, and magnetizing a pinned layer of each of the magnetic field detectors by applying, while heating the substrate, a magnetic field in a direction perpendicular on a surface of the substrate.

Preferably, the method further comprises the step of covering each of the fixed resistors by a magnetic shielding member with an insulating member of electrical insulation in between, wherein each of the fixed resistors includes a magneto-resistance effect element formed from the same layer configuration as the magnetic field detectors.

According to the above embodiments of the present invention, since the magnetic field detectors in the sensor bridge circuits are arranged on the inclined surfaces which have normal directions intersecting with each other in a three-dimensional manner, and the pair of the magnetic field detectors in the same sensor bridge circuits is arranged in the same inclined surface, by applying a magnetic field in one direction while heating the substrate in the magnetic field only once, it is possible to magnetize the pinned layers of the magnetic field detectors in one direction, and it is possible to realize magnetization in three magnetization directions, in which magnetization directions of the pinned layers in different coordinate systems intersect with each other in a three-dimensional manner. As a result, it is possible to reduce the number of fabrication steps, and improve fabrication yields. In addition, since the integration mounting on the substrate is possible, the magnetic sensor can be made small and thin, and a large number of the magnetic sensors can be fabricated; that is, productivity is improved.

These and other objects, features, and advantages of the present invention will become more apparent from the following detailed description of preferred embodiments given with reference to the accompanying drawings.

BRIEF DESCRIPTION OF THE DRAWINGS

FIG. 17 is a flowchart, continuing from the flow chart in FIG. 16, illustrating the method of producing the magnetic sensor 201 of the present embodiment.

DESCRIPTION OF THE PREFERRED EMBODIMENTS

Figure 1:
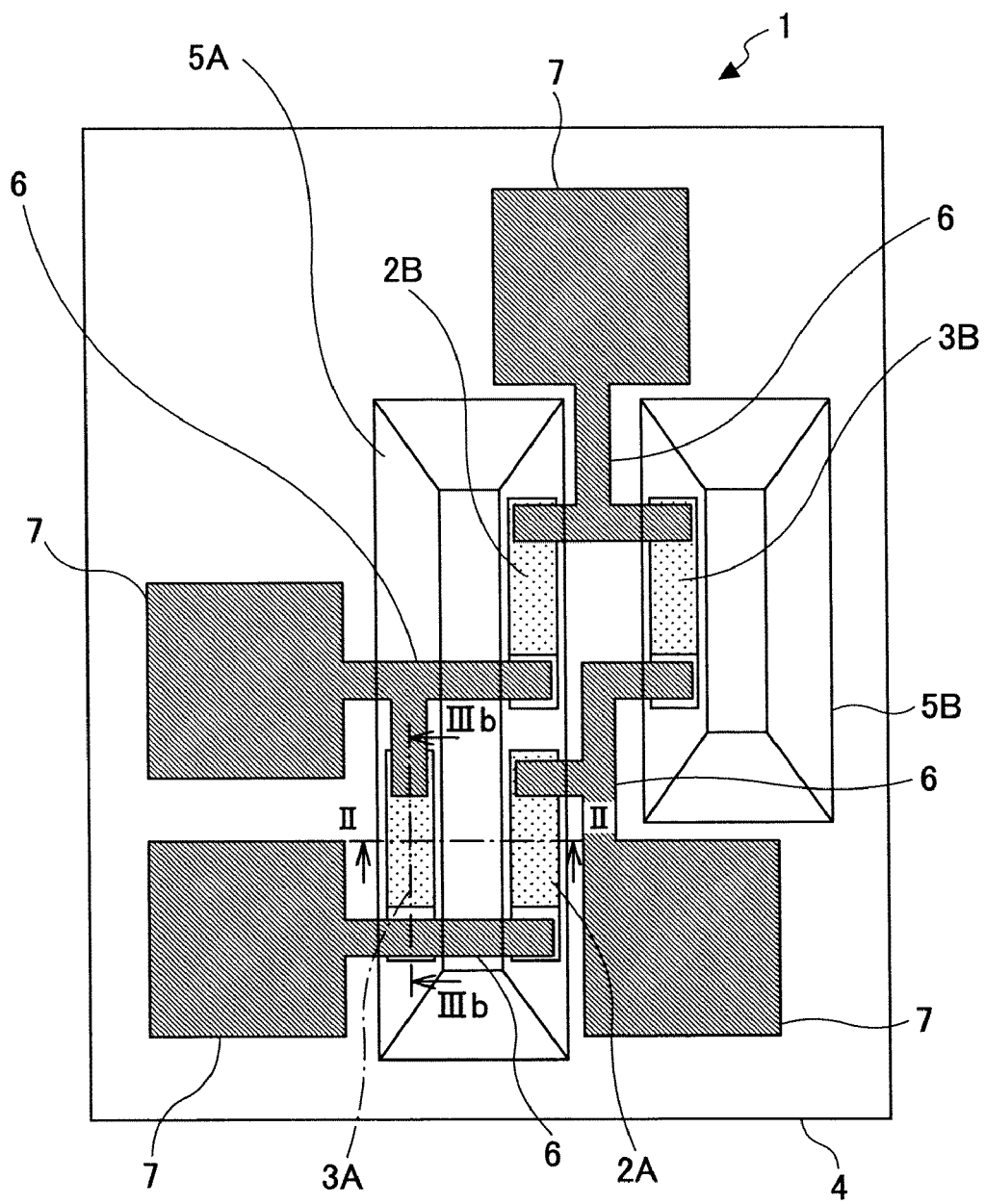
FIG. 1 is a plan view schematically illustrating a configuration of a magnetic sensor according to a first embodiment, in which magneto-resistance effect elements are connected to form a bridge circuit.

Below, preferred embodiments of the present invention are explained with reference to the accompanying drawings.

The magnetic sensor of the present invention may include a substrate; and plural sensor bridge circuits each including a pair of magnetic field detectors and a pair of fixed resistors arranged on the substrate, the pair of the magnetic field detectors and the pair of the fixed resistors being connected to form a bridge circuit, each of the magnetic field detectors being formed from a magneto-resistance effect element, magnetization directions of the magnetic field detectors intersecting with each other in a three-dimensional manner. The substrate has plural inclined surfaces which have normal directions intersecting with each other in a three-dimensional manner, and the pair of the magnetic field detectors in each of the sensor bridge circuits is arranged in the same inclined surface.

According to the above configuration, the substrate has plural inclined surfaces which have normal directions intersecting with each other in a three-dimensional manner, and the pair of the magnetic field detectors in each of the sensor bridge circuits is arranged in the same inclined surface.

As a result, by applying a magnetic field in one direction while heating the substrate in the magnetic field only once, it is possible to magnetize the pinned layers of the magnetic field detectors in one direction, and it is possible to realize magnetization in three magnetization directions, in which magnetization directions of the pinned layers in different coordinate systems intersect with each other in a three-dimensional manner. Therefore, it is possible to reduce the number of fabrication steps, and improve fabrication yields. In addition, since the integration mounting on the substrate is possible, the magnetic sensor can be made small and thin, and a large number of the magnetic sensors can be fabricated, that is, productivity is improved.

Preferably, the substrate may be formed from a (100) single crystal silicon wafer, and has plural inclined surfaces of normal directions intersecting with each other in a three-dimensional manner, each of the inclined surfaces being a (111) orientation crystal plane forming an angle of 55 degrees relative to a surface of the substrate, and the pair of the magnetic field detectors in each of the sensor bridge circuits is arranged in the same inclined surface.

According to the above configuration, the substrate is formed from a (100) single crystal silicon wafer, and has plural inclined surfaces of normal directions intersecting with each other in a three-dimensional manner, each of the inclined surfaces being a (111) orientation crystal plane forming an angle of 55 degrees relative to a surface of the substrate, and the pair of the magnetic field detectors in each of the sensor bridge circuits are arranged in the same inclined surface.

As a result, by applying a magnetic field in one direction while heating the substrate in the magnetic field only once, it is possible to magnetize the pinned layers of the magnetic field detectors in one direction, and it is possible to realize magnetization in three magnetization directions, in which magnetization directions of the pinned layers in different coordinate systems intersect with each other in a three-dimensional manner. Therefore, it is possible to reduce the number of fabrication steps, and improve fabrication yields. In addition, since the integration mounting on the substrate is possible, the magnetic sensor can be made small and thin, and a large number of the magnetic sensors can be fabricated, that is, productivity is improved.

Further, since the inclined surfaces, on which the magnetic sensors are arranged, are defined by crystal planes, position precision of the magnetic sensors in different axial directions is very high, and the positional relation of the three axial directions is uniquely defined by the positional relation of the crystal planes; therefore, it is possible to fabricate the magnetic sensor with little fluctuation.

Alternatively, the magnetic sensor of the present invention may include a substrate; and a first sensor bridge circuit, a second sensor bridge circuit, and a third sensor bridge circuit, each of the first sensor bridge circuit, the second sensor bridge circuit, and the third sensor bridge circuit including a pair of magnetic field detectors and a pair of reference resistors arranged on the substrate and connected to form a bridge circuit, each of the magnetic field detectors being formed from a magneto-resistance effect element, each of reference resistors having a constant resistance value not influenced by an external magnetic field, the magnetization directions of the magnetic field detectors intersecting with each other in a three-dimensional manner, wherein the substrate has plural inclined surfaces, normal directions of the inclined surfaces intersecting with each other in a three-dimensional manner, and the magnetic field detectors in each of the first sensor bridge circuit, the second sensor bridge circuit, and the third sensor bridge circuit are arranged in the inclined surfaces having normal directions intersecting with each other in a three-dimensional manner, and the pair of the magnetic field detectors in the same one of the first sensor bridge circuit, the second sensor bridge circuit, and the third sensor bridge circuit are arranged in the inclined surfaces having the same normal direction.

According to the above configuration, the substrate has plural inclined surfaces which have normal directions intersecting with each other in a three-dimensional manner, the magnetic field detectors in each of the first sensor bridge circuit, the second sensor bridge circuit, and the third sensor bridge circuit are arranged in the inclined surfaces having normal directions intersecting with each other in a three-dimensional manner, and the pair of the magnetic field detectors in the same one of the first sensor bridge circuit, the second sensor bridge circuit, and the third sensor bridge circuit is arranged in the inclined surfaces having the same normal direction.

As a result, by applying a magnetic field in one direction while heating the substrate in the magnetic field only once, it is possible to magnetize the pinned layers of the magnetic field detectors in one direction, and it is possible to realize magnetization in three magnetization directions, in which magnetization directions of the pinned layers in different coordinate systems intersect with each other in a three-dimensional manner. Therefore, it is possible to reduce the number of fabrication steps, and improve fabrication yields. In addition, since the integration mounting on the substrate is possible, the magnetic sensor can be made small and thin, and a large number of the magnetic sensors can be fabricated, that is, productivity is improved.

Preferably, the substrate may be formed from a (100) single crystal silicon wafer, and has plural inclined surfaces of normal directions intersecting with each other in a three-dimensional manner, each of the inclined surfaces being a (111) orientation crystal plane forming an angle of 55 degrees relative to a surface of the substrate, the magnetic field detectors in each of the first sensor bridge circuit, the second sensor bridge circuit, and the third sensor bridge circuit are arranged in the inclined surfaces having normal directions intersecting with each other in a three-dimensional manner, and the pair of the magnetic field detectors in the same one of the first sensor bridge circuit, the second sensor bridge circuit, and the third sensor bridge circuit are arranged in the inclined surfaces having the same normal direction.

According to the above configuration, the substrate is formed from a (100) single crystal silicon wafer, and has plural inclined surfaces of normal directions intersecting with each other in a three-dimensional manner, each of the inclined surfaces being a (111) orientation crystal plane forming an angle of 55 degrees relative to a surface of the substrate, the magnetic field detectors in each of the first sensor bridge circuit, the second sensor bridge circuit, and the third sensor bridge circuit are arranged in the inclined surfaces having normal directions intersecting with each other in a three-dimensional manner, and the pair of the magnetic field detectors in the same one of the first sensor bridge circuit, the second sensor bridge circuit, and the third sensor bridge circuit are arranged in the inclined surfaces having the same normal direction.

As a result, by applying a magnetic field in one direction while heating the substrate in the magnetic field only once, it is possible to magnetize the pinned layers of the magnetic field detectors in one direction, and it is possible to realize magnetization in three magnetization directions, in which magnetization directions of the pinned layers in different coordinate systems intersect with each other in a three-dimensional manner. Therefore, it is possible to reduce the number of fabrication steps, and improve fabrication yields. In addition, since the integration mounting on the substrate is possible, the magnetic sensor can be made small and thin, and a large number of the magnetic sensors can be fabricated; that is, productivity is improved.

Further, since the inclined surfaces, on which the magnetic sensors are arranged, are defined by crystal planes, position precisions of the magnetic sensors in different axial directions are very high, positional relation of the three axial directions is uniquely defined by positional relation of the crystal planes; therefore, it is possible to fabricate the magnetic sensor with little fluctuation.

Preferably, each of the fixed resistors may include a magneto-resistance effect element formed from the same layer configuration as the magnetic field detectors, and is covered by a magnetic shielding member with an insulating member of electrical insulation in between.

According to the above configuration, since each of the fixed resistors is covered by a magnetic shielding member with an insulating member of electrical insulation in between, the fixed resistors have constant resistance without being influenced by external magnetic field even when the magnetic sensor is sensitive to the external magnetic field of a magneto-resistance effect element. In addition, since each of the fixed resistors includes a magneto-resistance effect element formed from the same layer configuration as the magnetic field detectors, the magnetic sensor has uniform temperature characteristics, and thus stable performance.

Preferably, the fixed resistors may be arranged on the inclined surfaces formed on the substrate.

According to the above configuration, it is possible to reduce the area occupied by the magnetic sensor, a large number of chips can be cut out from a silicon wafer, and this reduces fabrication cost.

Preferably, the magneto-resistance effect element may include a tunnel magneto-resistance effect element.

According to the above configuration, since the magneto-resistance effect element includes a tunnel magneto-resistance effect element, it is possible to reduce power consumption in magnetic detection.

The method of producing a magnetic sensor according to the present invention may include the steps of preparing a substrate; forming plural inclined surfaces on the substrate, normal directions of the inclined surfaces intersecting with each other in a three-dimensional manner, arranging a pair of magnetic field detectors in each of plural sensor bridge circuits in the same inclined surface, each of the sensor bridge circuits including the pair of magnetic field detectors and a pair of fixed resistors arranged on the substrate, the pair of the magnetic field detectors and the pair of the fixed resistors being connected to form a bridge circuit, each of the magnetic field detectors being formed from a magneto-resistance effect element, and magnetizing a pinned layer of each of the magnetic field detectors by applying, while heating the substrate, a magnetic field in a direction perpendicular on a surface of the substrate.

According to the above configuration, since magnetization (namely, fixing the magnetization direction) of the pinned layers of the magnetic field detectors formed from a magneto-resistance effect element is performed by applying a magnetic field in a direction perpendicular on a surface of the substrate while heating the substrate, it is possible to complete magnetization of the magnetic field detectors in one magnetization step.

Preferably, the method may further include the step of covering each of the fixed resistors by a magnetic shielding member with an insulating member of electrical insulation in between, wherein each of the fixed resistors includes a magneto-resistance effect element formed from the same layer configuration as the magnetic field detectors.

According to the above configuration, since each of the fixed resistors is covered by a magnetic shielding member with an insulating member of electrical insulation in between, the fixed resistors have constant resistance without being influenced by external magnetic field even when the magnetic sensor is sensitive to the external magnetic field of a magneto-resistance effect element. In addition, since each of the fixed resistors includes a magneto-resistance effect element formed from the same layer configuration as the magnetic field detectors, the magnetic sensor has uniform temperature characteristics, and thus stable performance.

Preferably, the magneto-resistance effect element may include a tunnel magneto-resistance effect element.

According to the above configuration, it is possible to reduce power consumption in magnetic detection.

Below, preferred embodiments of the present invention are explained with reference to the accompanying drawings.

Embodiment 1

In this embodiment, magnetic field detectors are arranged in the same inclined surface having a certain angle.

FIG. 1 is a plan view schematically illustrating a configuration of a magnetic sensor according to a first embodiment, in which magneto-resistance effect elements are connected to form a bridge circuit.

As shown in FIG. 1, a magnetic sensor 1 of the present embodiment includes a substrate 4, a magnetic field detector 2A, a magnetic field detector 2B, a fixed resistor 3A, a fixed resistor 3B arranged on the substrate 4, grooves 5A, 5B (collectively referred to as "grooves 5" where necessary), connection wirings 6, and bonding pads 7.

For example, the magnetic field detectors 2A, 2B, the fixed resistors 3A, 3B are Tunnel Magneto-Resistive (TMR) elements. In addition, the magnetic field detectors 2A, 2B, and the fixed resistors 3A, 3B have the same layer configuration. In each of the fixed resistors 3A, 3B, a magnetic shielding film is provided to reduce sensitivity to external magnetic fields. The magnetic shielding film is described in detail below.

In this embodiment, the substrate 4 of the magnetic sensor 1 is formed from a (100) single crystal silicon wafer. The two grooves 5A and 5B each having a depth of 100 μm are formed in the (100) silicon wafer 4, for example, by etching with a silicon nitride etching mask and KOH (potassium hydroxide) etching liquid or TMAH (Tetramethylammonium hydroxide) etching liquid. Each of the grooves 5A and 5B is formed from four inclined surfaces each having an angle of 55 degrees relative to the surface of the substrate 4.

Figure 2:
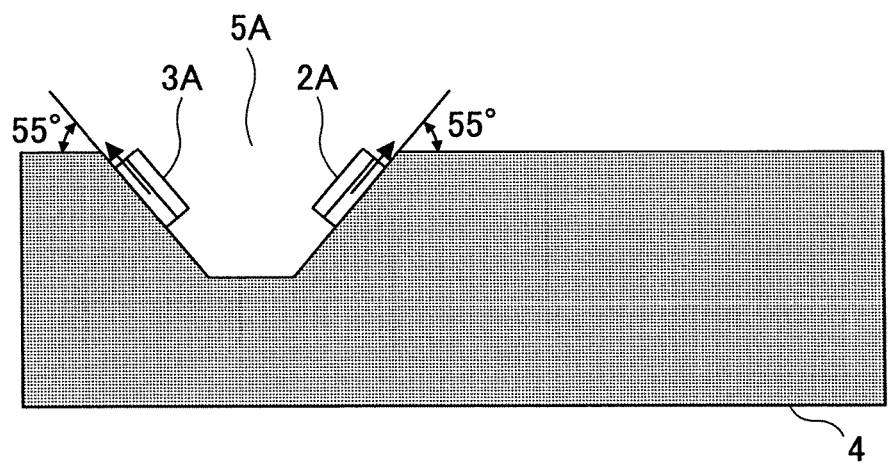
FIG. 2 is a cross-sectional view along a II-II line in FIG. 1 for schematically illustrating the magneto-resistance effect elements arranged on the inclined surfaces.

FIG. 2 is a cross-sectional view along a II-II line in FIG. 1 for schematically illustrating the magneto-resistance effect elements arranged on the inclined surfaces.

As shown in FIG. 2 and FIG. 1, the magnetic field detectors 2A, 2B, and the fixed resistors 3A, 3B are arranged on the inclined surfaces of the grooves 5A and 5B in the substrate 4 with orientation of magnetization within the inclined surfaces, in addition, the magnetization directions are determined so that magnetization sensing directions are along a depth direction of the inclined surfaces, and intersect with longitudinal directions of the magneto-resistance effect elements (the magnetic field detectors 2A, 2B, and the fixed resistors 3A, 3B).

In this embodiment, as shown in FIG. 2, the bottom surfaces of the grooves 5A and 5B are flat, that is, approximately parallel to the surface of the substrate 4, but the bottom surfaces of the grooves 5A and 5B can have other shapes. For example, the bottom surfaces of the grooves 5A and 5B may be V-shaped without a flat portion. In this case, the areas occupied by the grooves 5A and 5B are reduced by the size of the flat bottom surface, and the magnetic sensor 1 can be made small.

As shown in FIG. 1, the magneto-resistance effect elements (the magnetic field detectors 2A, 2B, and the fixed resistors 3A, 3B) are arranged on the inclined surfaces of the grooves 5A, 5B opposite to each other, and occupy most of the widths of the inclined surfaces of the grooves 5A, 5B. Because of this arrangement, a configuration close to V-shaped grooves can be realized, and the magnetic sensor 1 can be made small.

As shown in FIG. 1, the magnetic field detectors 2A, 2B and the fixed resistors 3A, 3B are connected through the connection wirings 6 to constitute a bridge circuit (refer to FIG. 3), and are connected to bonding pads 7, which serve as input and output terminals. The connection wirings 6 are arranged in the space between the grooves 5A, 5B.

In this embodiment, it is described that the grooves 5A, 5B are engraved in the substrate 4, but the grooves 5A, 5B may be replaced by projections on the substrate 4 formed by etching using an inverted etching mask and KOH (potassium hydroxide) etching liquid or TMAH (Tetramethylammonium hydroxide) etching liquid.

However, since the connection wirings 6 and the bonding pads 7 are arranged on the etched surface, it is required that the etched surface be flat.

In addition, besides the (100) single crystal silicon wafer, the substrate 4 of the magnetic sensor 1 may also be formed from a (110) silicon wafer, semiconductors other than silicon, glass materials, ceramic materials, non-magnetic metals, and others. In addition, in this embodiment, it is described that the grooves 5A and 5B have an inversed trapezoidal shape, obtained by cutting the top portion of a rectangular pyramid, but the grooves 5A and 5B may also be formed from a triangular pyramid, or other pyramids having any sides, or a cone.

When the (100) silicon wafer is used for the substrate 4, because a (111) crystal plane inclined by an angle of 55 degrees relative to the surface of the substrate 1 can be stably formed by anisotropic wet etching using KOH or other etching liquid, the positional relation of the magnetic field detectors 2A, 2B is constant; thus fabrication reproducibility is good, and fabrication yield is high. Hence, in this embodiment, it is preferable to use the (100) silicon wafer for the substrate 4.

Below, the bridge circuit constituted by the magnetic field detectors 2A, 2B, and the fixed resistors 3A, 3B is described with reference to FIG. 3.

Figure 3:
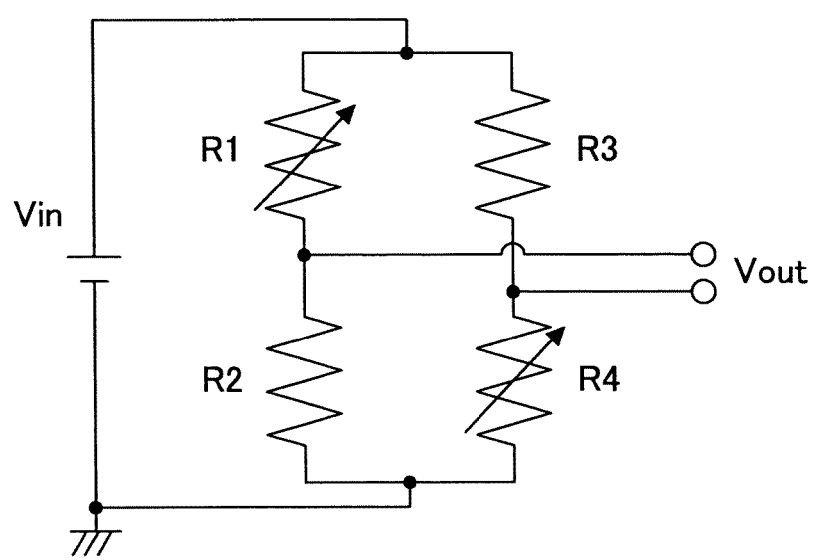
FIG. 3 is a circuit diagram illustrating a bridge circuit.

FIG. 3 is a circuit diagram illustrating a bridge circuit.

In this embodiment, as shown in FIG. 1, the magnetic field detectors 2A, 2B are arranged on the same inclined surface, while the fixed resistors 3A, 3B are respectively arranged on two inclined surfaces which are parallel to each other and are different from the inclined surface where the magnetic field detectors 2A, 2B are arranged. The magnetic field detectors 2A, 2B and the fixed resistors 3A, 3B constitute resistance R1, R2, R3, R4 of the bridge circuit shown in FIG. 3.

In FIG. 3, R1 corresponds to the magnetic field detector 2B, R2 corresponds to the fixed resistor 3A, R3 corresponds to the fixed resistor 3B, and R4 corresponds to the magnetic field detector 2A.

Since the magnetic sensor 1 of the present embodiment forms a bridge circuit, it is possible to detect a magnetic field with high precision by a null method, which is independent of variation of a power voltage, input impedance of the detector, or non-linearity.

Next, the magneto-resistance effect element, specifically, the TMR element, used in the present embodiment is described with the fixed resistor 3A as an example.

Figure 4A:
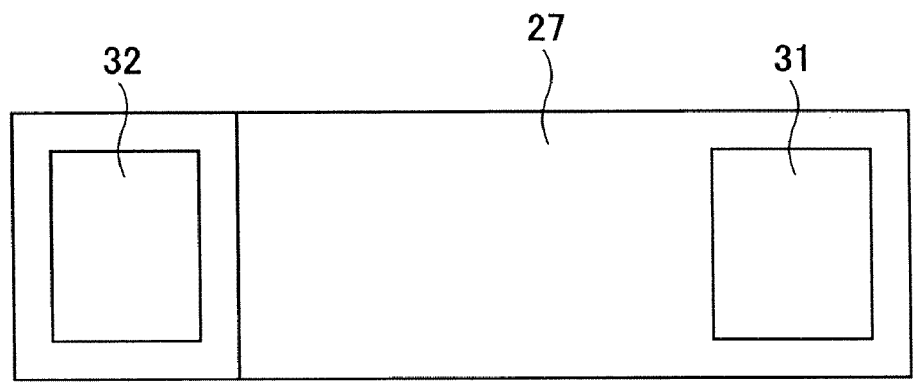
FIG. 4A is a plan view illustrating a configuration of a magneto-resistance effect element.

FIG. 4A is a plan view illustrating a configuration of a magneto-resistance effect element.

Figure 4B:
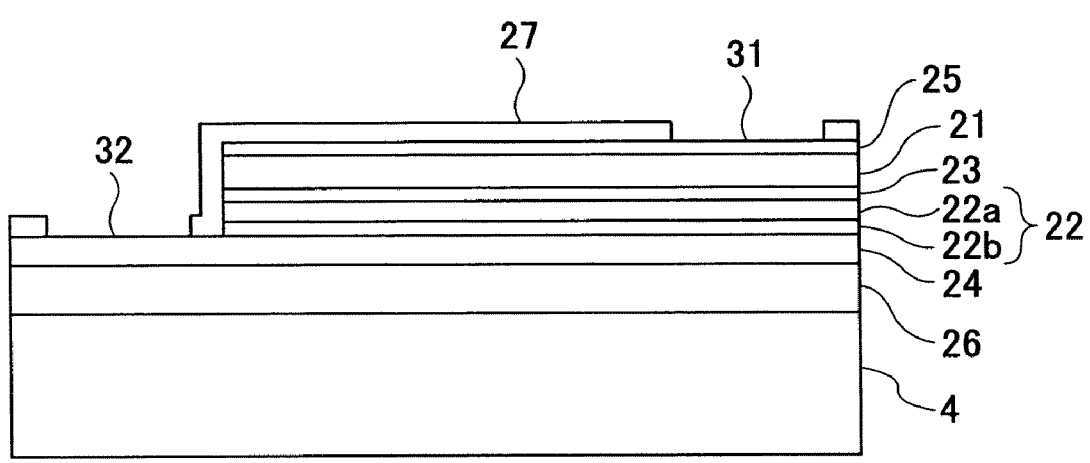
FIG. 4B is a cross-sectional view along a IIIb-IIIb line in FIG. 1 for illustrating a configuration of a magneto-resistance effect element.

FIG. 4B is a cross-sectional view along a IIIb-IIIb line in FIG. 1 for illustrating a configuration of a magneto-resistance effect element.

As shown in FIG. 4B, the fixed resistor 3A includes a free layer 21, a pinned layer 22, an insulating layer 23, an electrode 24 on the side of the pinned layer 22, and a cap layer 25. In addition, the fixed resistor 3A is covered by an insulating layer 26 ensuring insulation with the substrate 4, and a passivation film 27.

As shown in FIG. 4A, a pinned-layer-side contact hole 31 and a free-layer-side contact hole 32 are formed in the passivation film 27 for bonding the electrode 24 and the cap layer 25 with a wiring electrode, and wirings (not illustrated) for electrical connection are arranged through the contact hole 31 and the contact hole 32.

The free layer 21 has a magnetization direction changing in response to the direction of the external magnetic field, whereas the pinned layer 22 has a fixed magnetization direction, which does not change depending on the direction of the external magnetic field.

The insulating layer 23 is sandwiched by the free layer 21 and the pinned layer 22, and functions as a tunneling layer.

In the fixed resistor 3A, which is a TMR element, the pinned layer 22 deposited on the substrate 4 may be formed from an antiferromagnetic layer 22a, like Fe—Ni, and a magnetic layer 22b, like Co—Fe. The insulating layer 23 is deposited on the pinned layer 22, and the free layer 21 is further deposited on the insulating layer 23.

For example, the insulating layer 23 may be formed from insulating materials like $SiO_2$, or non-magnetic oxide of metal, like $Al_2O_3$, or MgO, and the free layer 21 may be formed from Co—Fe, or Fe—Ni.

Note that in the present embodiment, the magneto-resistance effect element is not limited to a TMR element, for example, it can be a GMR element.

Figure 5:
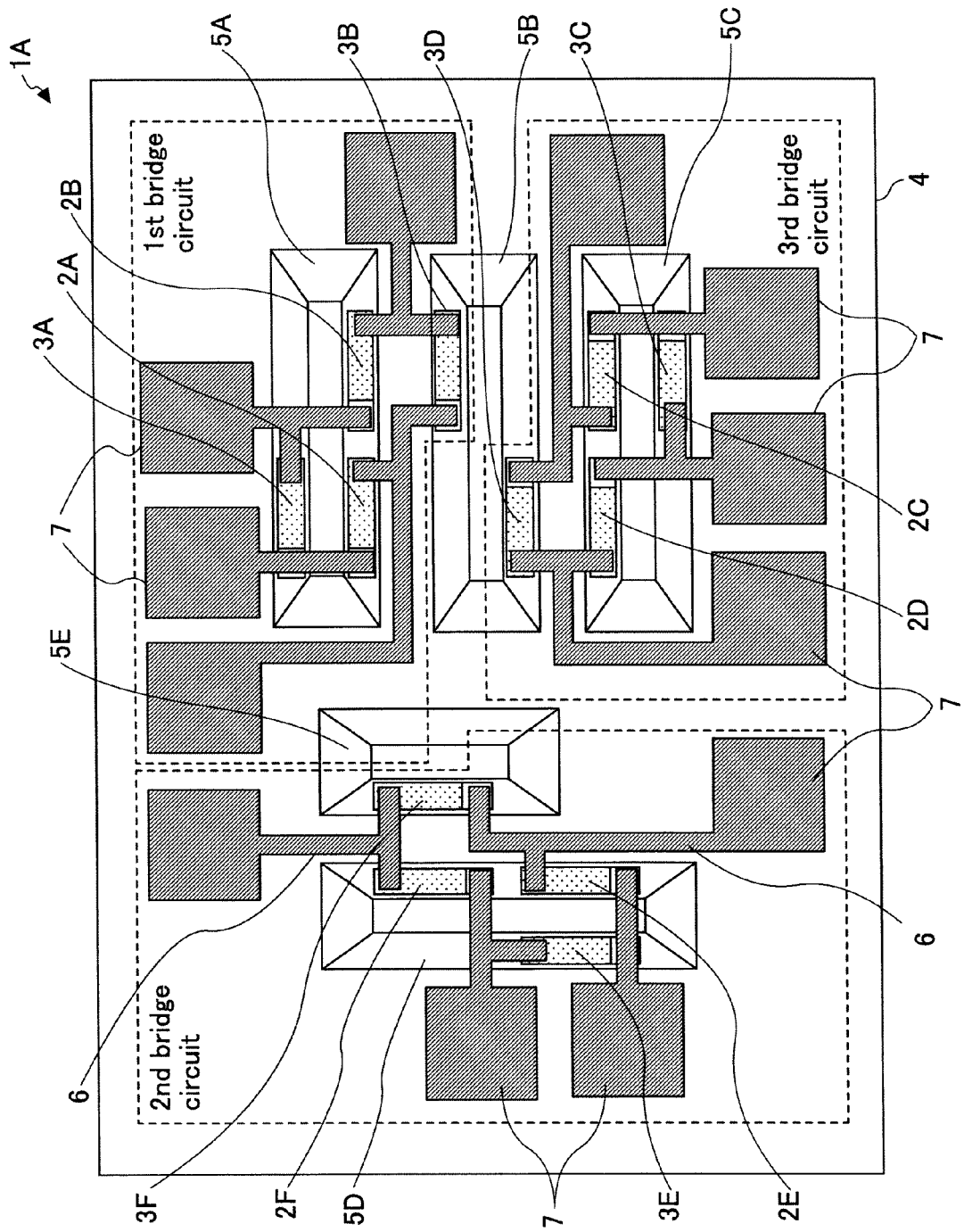
FIG. 5 is a plan view schematically illustrating a configuration of a three-axis magnetic sensor according to the present embodiment, which includes three sets of one-axis magnetic sensors.

FIG. 5 is a plan view schematically illustrating a configuration of a three-axis magnetic sensor according to the present embodiment, which includes three sets of one-axis magnetic sensors.

As shown in FIG. 5, a three-axis magnetic sensor 1A of the present embodiment includes a substrate 4, six magnetic field detectors 2A, 2B, 2C, 2D, 2E, 2F (collectively referred to as "magnetic field detectors 2" where necessary), six fixed resistors 3A, 3B, 3C, 3D, 3E, 3F (collectively referred to as "fixed resistors 3" where necessary), five grooves 5A, 5B, 5C, 5D, 5E (collectively referred to as "grooves 5" where necessary), twelve bonding pads 7, and connection wirings 6 for electrical connection between the magnetic field detectors 2A, 2B, 2C, 2D, 2E, 2F and the fixed resistors 3A, 3B, 3C, 3D, 3E, 3F.

The magnetic field detectors 2A, 2B, 2C, 2D, 2E, 2F and the fixed resistors 3A, 3B, 3C, 3D, 3E, 3F are Tunnel Magneto-Resistive (TMR) elements, and have the same layer configuration.

The substrate 4 of the three-axis magnetic sensor 1A is formed from a (100) silicon wafer. The five grooves 5A, 5B, 5C, 5D, 5E each having a depth of 100 μm are formed in the (100) silicon wafer 4, for example, by etching with a silicon nitride etching mask and KOH (potassium hydroxide) etching liquid or TMAH (Tetramethylammonium hydroxide)

etching liquid. Each of the grooves 5A, 5B, 5C, 5D, 5E is formed from four inclined surfaces each having an angle of 55 degrees relative to the surface of the substrate 4.

The magnetic field detectors 2A, 2B, 2C, 2D, 2E, 2F and the fixed resistors 3A, 3B, 3C, 3D, 3E, 3F are arranged on the inclined surfaces of the grooves 5A, 5B, 5C, 5D, 5E in the substrate 4 with orientation of magnetization within the inclined surfaces, in addition, the magnetization directions are determined so that magnetization sensing directions are is along a depth direction of the inclined surfaces, and intersect with longitudinal directions of the magneto-resistance effect elements (the magnetic field detectors 2A, 2B, 2C, 2D, 2E, 2F and the fixed resistors 3A, 3B, 3C, 3D, 3E, 3F).

In this embodiment, the bottom surfaces of the grooves 5A, 5B, 5C, 5D, 5E are flat, that is, approximately parallel to the surface of the substrate 4, but the bottom surfaces of the grooves 5A, 5B, 5C, 5D, 5E can have other shapes. For example, the bottom surfaces of the grooves 5A, 5B, 5C, 5D, 5E may be V-shaped but not flat. In this case, the areas occupied by the grooves 5A, 5B, 5C, 5D, 5E are reduced by the size of the flat bottom surface, and the three-axis magnetic sensor 1A can be made small.

The magneto-resistance effect elements (the magnetic field detectors 2A, 2B, 2C, 2D, 2E, 2F and the fixed resistors 3A, 3B, 3C, 3D, 3E, 3F) are arranged on the inclined surfaces of the grooves 5A, 5B, 5C, 5D, 5E opposite to each other, and occupy most of the widths of the inclined surfaces of the grooves 5A, 5B, 5C, 5D, 5E. Because of this arrangement, a configuration close to V-shaped grooves can be realized, and the three-axis magnetic sensor 1A can be made small.

In the three-axis magnetic sensor 1A shown in FIG. 5, the magnetic field detectors 2A, 2B function as a one-axis magnetic sensor adapted to a first axis direction, and form a first bridge circuit in combination with the fixed resistors 3A, 3B.

The magnetic field detectors 2C, 2D function as a one-axis magnetic sensor adapted to a second axis direction, and form a second bridge circuit in combination with the fixed resistors 3C, 3D.

The magnetic field detectors 2E, 2F function as a one-axis magnetic sensor adapted to a third axis direction, and form a third bridge circuit in combination with the fixed resistors 3E, 3F.

Magnetization directions of pinned layers 22 in the magnetic field detectors 2A, 2B, 2C, 2D, 2E, 2F are different from each other in the three one-axis magnetic sensors formed from the first bridge circuit, the second bridge circuit, and the third bridge circuit, respectively. Specifically, magnetization directions of the pinned layers 22 in the X-axis and the Z-axis are perpendicular to each other in the paper, and the magnetization directions of the pinned layers 22 in the X-axis and the Y-axis are anti-parallel to each other in the paper. Namely, the magnetization directions of the pinned layers 22 in the X-axis, Y-axis, and the Z-axis sterically radiate in three directions at 55 degrees relative to the surface of the substrate.

It should be noted that arrangement of the magnetic field detectors 2A, 2B, 2C, 2D, 2E, 2F and the fixed resistors 3A, 3B, 3C, 3D, 3E, 3F is not limited to the above embodiment as long as the magnetization directions of the pinned layers in the X-axis, Y-axis, and the Z-axis are different from each other.

Embodiment 2

Similar to the first embodiment, in this embodiment, magnetic field detectors are arranged in the same inclined surface having a certain angle.

Figure 6:
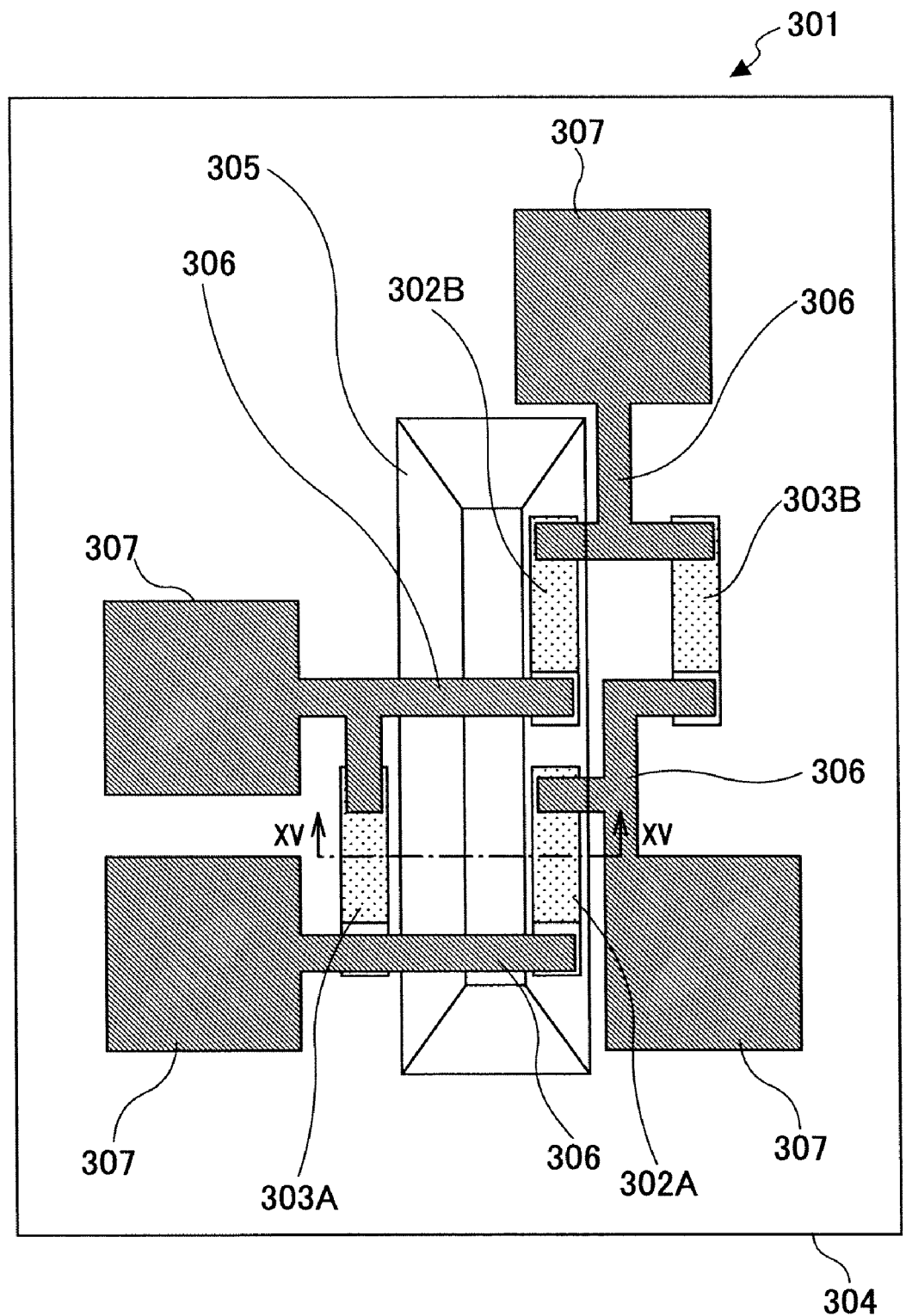
FIG. 6 is a plan view schematically illustrating a configuration of a magnetic sensor according to a second embodiment, in which magneto-resistance effect elements are connected to form a bridge circuit.

FIG. 6 is a plan view schematically illustrating a configuration of a magnetic sensor according to a second embodiment, in which magneto-resistance effect elements are connected to form a bridge circuit.

As shown in FIG. 1, a magnetic sensor 301 of the present embodiment includes a substrate 304, a magnetic field detector 302A, a magnetic field detector 302B, a fixed resistor 303A, a fixed resistor 303B arranged on the substrate 304, a groove 305, connection wirings 306, and bonding pads 307.

In the magnetic sensor 301, the fixed resistor 303A and the fixed resistor 303B are arranged on the same surface where the bonding pads 307 are formed.

Here, for example, the magnetic field detectors 302A, 302B, the fixed resistors 303A, 303B are Tunnel Magneto-Resistive (TMR) elements, and have the same layer configuration. In each of the fixed resistors 303A, 303B, a magnetic shielding film is provided to reduce sensitivity to external magnetic fields. The magnetic shielding film is described in detail below.

In this embodiment, the substrate 304 of the magnetic sensor 301 is formed from a (100) single crystal silicon wafer. The groove 305 having a depth of 200 μm are formed in the (100) silicon wafer 304, for example, by etching with a silicon nitride etching mask and KOH (potassium hydroxide) etching liquid or TMAH (Tetramethylammonium hydroxide) etching liquid. The groove 305 is formed from four inclined surfaces each having an angle of 55 degrees relative to the surface of the substrate 304.

Figure 7:
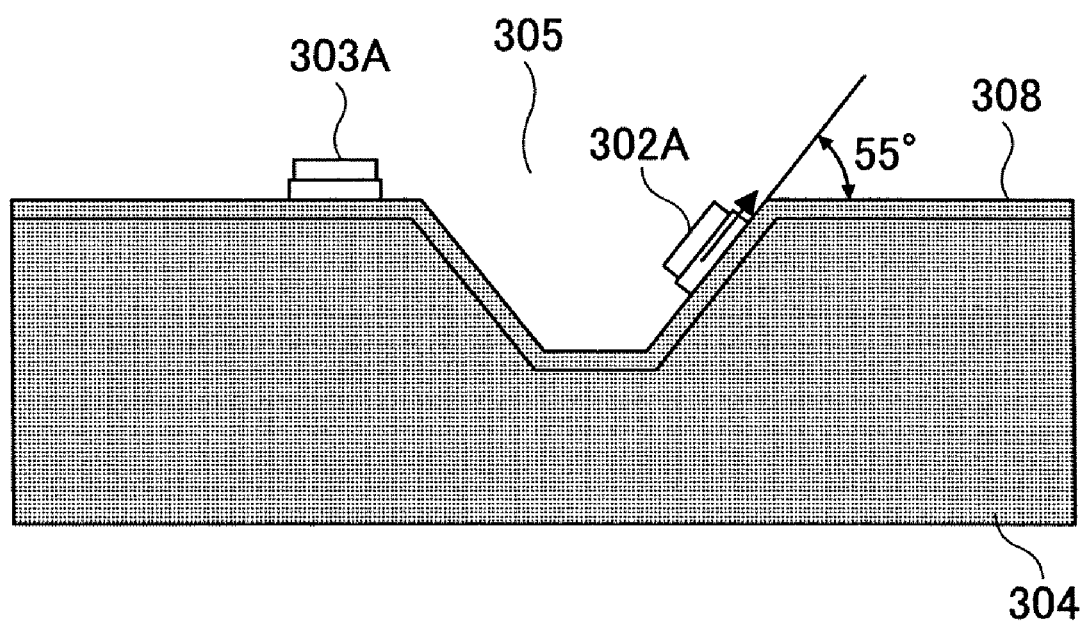
FIG. 7 is a cross-sectional view along a XV-XV line in FIG. 6 for schematically illustrating the magnetic field detector 302A arranged on the inclined surface.

FIG. 7 is a cross-sectional view along a XV-XV line in FIG. 6 for schematically illustrating the magnetic field detector 302A arranged on the inclined surface.

As shown in FIG. 7 and FIG. 6, the magnetic field detectors 302A, 302B are arranged on the inclined surface of the groove 305 in the substrate 304 with orientation of magnetization within the inclined surface, in addition, the magnetization directions are determined so that magnetization sensing directions are along a depth direction of the inclined surface, and intersect with longitudinal directions of the magneto-resistance effect elements (the magnetic field detectors 302A, 302B).

In this embodiment, as shown in FIG. 7, the bottom surface of the groove 305 is flat, that is, approximately parallel to the surface of the substrate 304, but the bottom surface of the groove 305 can have other shapes. For example, the bottom surface of the groove 305 may be V-shaped with a flat portion. In this case, the area occupied by the groove 305 is reduced by the size of the flat bottom surface, and the magnetic sensor 301 can be made small.

As shown in FIG. 6, the magnetic field detectors 302A, 302B and the fixed resistors 303A, 303B are connected through the connection wirings 306 to form a bridge circuit (refer to FIG. 3), and are connected to bonding pads 307, which serve as input and output terminals.

In addition to the (100) single crystal silicon wafer, the substrate 304 of the magnetic sensor 301 may also be formed from a (110) silicon wafer, semiconductors other than silicon, glass materials, ceramic materials, non-magnetic metals, and others. However, when the (100) silicon wafer is used for the substrate 304, because a (111) crystal plane inclined by an angle of 55 degrees relative to the surface of the substrate 301 can be stably formed by anisotropic wet etching using KOH or other etching liquid, the positional relation of the magnetic field detectors 302A, 302B is constant; thus fabrication reproducibility is good, and fabrication yield is high, and hence, in this embodiment, it is preferable to use the (100) silicon wafer for the substrate 304.

Below, the bridge circuit constituted by the magnetic field detectors 302A, 302B, and the fixed resistors 303A, 303B is described, still with reference to FIG. 3.

In this embodiment, as shown in FIG. 6, the magnetic field detectors 302A, 302B are arranged on the same inclined surface of the substrate 304, while the fixed resistors 303A, 303B are arranged on a flat surface of the substrate 304. The magnetic field detectors 302A, 302B and the fixed resistors 303A, 303B constitute resistance R1, R2, R3, R4 of the bridge circuit shown in FIG. 3.

In FIG. 3, R1 corresponds to the magnetic field detector 302B, R2 corresponds to the fixed resistor 303A, R3 corresponds to the fixed resistor 303B, and R4 corresponds to the magnetic field detector 302A.

Since the magnetic sensor 301 of the present embodiment forms a bridge circuit, it is possible to detect a magnetic field with high precision by a null method, which is independent of variation of a power voltage, input impedance of the detector, or non-linearity.

The structure of the magneto-resistance effect elements (the magnetic field detectors 302A, 302B, and the fixed resistors 303A, 303B) is the same as that described in the first embodiment, and overlapping descriptions are omitted.

In addition, the magnetic sensor 301 shown in FIG. 6 may function as a one-axis magnetic sensor, and three sets of such one-axis magnetic sensors may be combined and appropriately arranged to form a three-axis magnetic sensor, as described in the first embodiment.

Similar to the first embodiment, the magneto-resistance effect elements (the magnetic field detectors 302A, 302B, the fixed resistors 303A, 303B) of the present embodiment are not limited to TMR elements, for example, they can be GMR elements.

According to the present embodiment, since the magnetic field detectors 302A, 302B are arranged on the inclined surface of the groove 305 of the substrate 304, while the fixed resistors 303A, 303B are arranged on the same flat surface of the substrate 304 where the bonding pads 307 are formed, the area occupied by the magnetic sensor 301 is small, a large number of chips can be cut out from a silicon wafer, and this reduces fabrication cost.

Embodiment 3

In this embodiment, magnetic field detectors and fixed resistors are arranged in inclined surfaces of the same groove.

Figure 8:
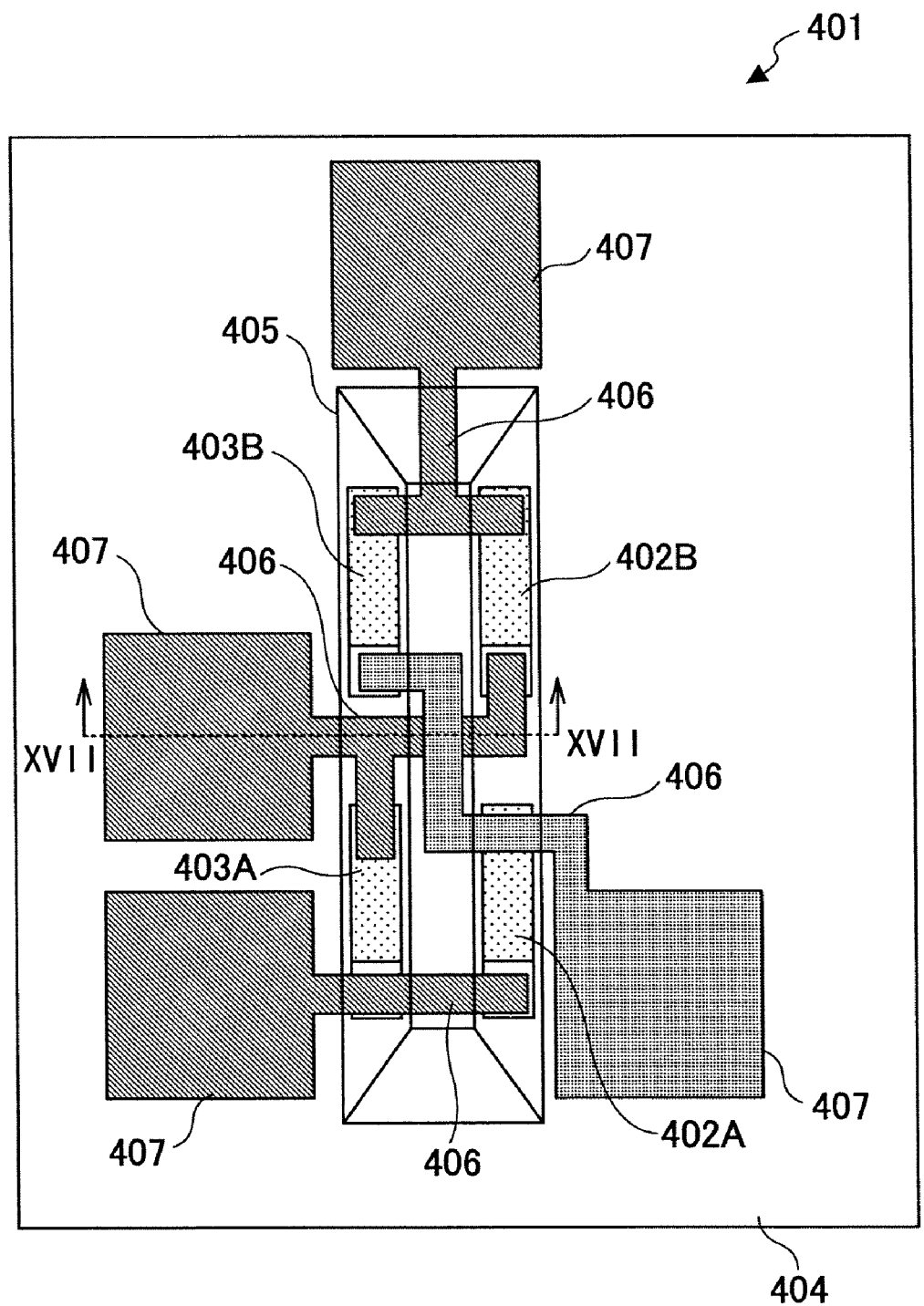
FIG. 8 is a plan view schematically illustrating a configuration of a magnetic sensor according to a third embodiment, in which magneto-resistance effect elements are connected to form a bridge circuit.

FIG. 8 is a plan view schematically illustrating a configuration of a magnetic sensor according to a third embodiment, in which magneto-resistance effect elements are connected to form a bridge circuit.

Figure 9:
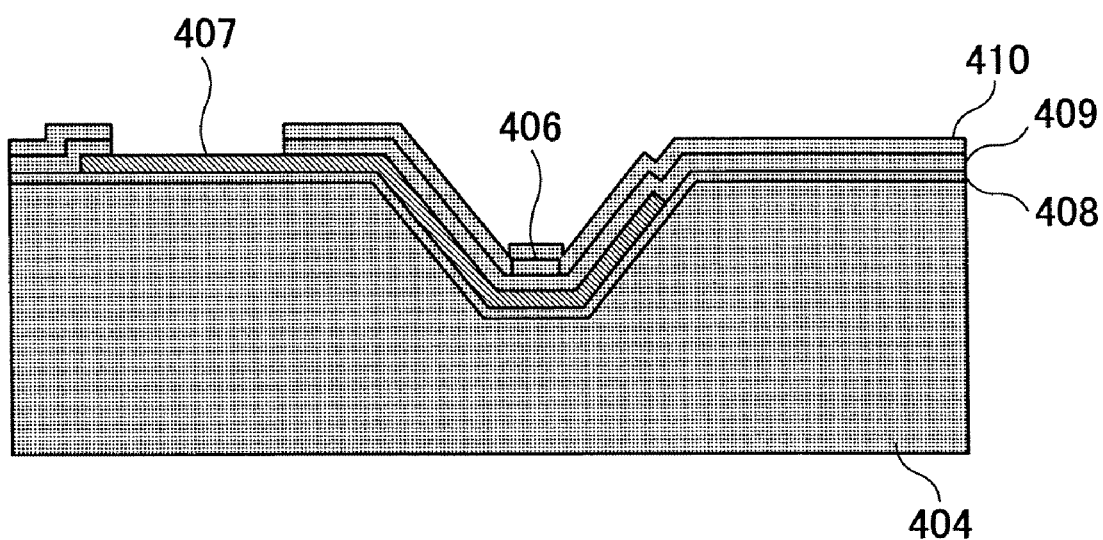
FIG. 9 is a cross-sectional view along a XVII-XVII line in FIG. 8.

FIG. 9 is a cross-sectional view along a XVII-XVII line in FIG. 8.

As shown in FIG. 8, a magnetic sensor 401 of the present embodiment includes a substrate 404, a magnetic field detector 402A, a magnetic field detector 402B, a fixed resistor 403A, a fixed resistor 403B arranged on the substrate 404, a groove 405, connection wirings 406, and bonding pads 407.

In the magnetic sensor 401, the magnetic field detector 402A, the magnetic field detector 402B, the fixed resistor 403A, and the fixed resistor 403B are arranged in the inclined surfaces of the same groove 405.

Here, for example, the magnetic field detectors 402A, 402B, the fixed resistors 403A, 403B are Tunnel Magneto-Resistive (TMR) elements, and have the same layer configuration. In each of the fixed resistors 403A, 403B, a magnetic shielding film is provided to reduce sensitivity to external magnetic fields. The magnetic shielding film is described in detail below.

In this embodiment, the substrate 404 of the magnetic sensor 401 is formed from a (100) single crystal silicon wafer. The groove 405 having a depth of 200 μm are formed in the (100) silicon wafer 404, for example, by etching with a silicon nitride etching mask and KOH (potassium hydroxide) etching liquid or TMAH (Tetramethylammonium hydroxide) etching liquid. The groove 405 is formed from four inclined surfaces each having an angle of 55 degrees relative to the surface of the substrate 404.

As shown in FIG. 9, the bottom surface of the groove 405 is flat, that is, approximately parallel to the surface of the substrate 404, but the bottom surface of the groove 405 can have other shapes. For example, the bottom surface of the groove 405 may be V-shaped with a flat portion.

The magnetic field detectors 402A, 402B and the fixed resistors 403A, 403B are connected through the connection wirings 406 to form a bridge circuit (refer to FIG. 3), and are connected to bonding pads 407, which serve as input and output terminals.

An insulating thin film 408 is provided between the substrate 404 and the bonding pads 407 for electrical insulation. For example, the insulating thin film 408 can be formed from silicon oxide by plasma CVD. Certainly, the insulating thin film 408 can be formed from any insulating materials able to be used for inter-layer insulation and by any methods. In this example, since the substrate 404 is made of a silicon wafer, a silicon oxide film formed by thermal oxidation of the substrate 404 can be used as the insulating thin film 408.

Two connection wirings 406 are arranged to intersect with each other. In order that the two connection wirings 406 do not directly contact each other, as shown in FIG. 9, an interlayer insulating layer 409 is formed to secure insulation between the two connection wirings 406. For example, a silicon oxide film formed with a plasma CVD device can be used as the interlayer insulating layer 409. It should be noted that as long as the interlayer insulating layer 409 is able to secure insulation between the two connection wirings 406, the interlayer insulating layer 409 is not limited to the silicon oxide film, and the method of producing the interlayer insulating layer 409 is not limited to plasma CVD.

A passivation film (insulating thin film) 410 is provided to cover the connection wirings 406, the bonding pads 407, and the magnetic field detector 402A, the magnetic field detector 402B, the fixed resistor 403A, and the fixed resistor 403B to prevent moisture and dust. For example, the passivation film 410 can be formed from silicon oxide by plasma CVD. Certainly, the passivation film 410 can be formed from any insulating materials able to be used for inter-layer insulation and by any methods.

In addition to the (100) single crystal silicon wafer, the substrate 404 of the magnetic sensor 401 may also be formed from a (110) silicon wafer, semiconductors other than silicon, glass materials, ceramic materials, non-magnetic metals, and others. however, when the (100) silicon wafer is used for the substrate 404, because a (111) crystal plane inclined by an angle of 55 degrees relative to the surface of the substrate 401 can be stably formed by anisotropic wet etching using KOH or other etching liquid, the positional relation of the magnetic field detectors 302A, 302B is constant, thus fabrication reproducibility is good, and fabrication yield is high; hence, in this embodiment, it is preferable to use the (100) silicon wafer for the substrate 404.

Below, the bridge circuit constituted by the magnetic field detectors 402A, 402B, and the fixed resistors 403A, 403B is described, still with reference to FIG. 3.

In this embodiment, as shown in FIG. 8, the magnetic field detector 402A and the magnetic field detector 402B are arranged on the same inclined surface of the groove 405, and the fixed resistor 403A and the fixed resistor 403B are arranged on the same inclined surface of the groove 405 opposite to the inclined surface where the magnetic field detector 402A and the magnetic field detector 402B are arranged. The magnetic field detectors 402A, 402B, and the fixed resistors 403A, 403B constitute resistance R1, R2, R3, R4 of the bridge circuit shown in FIG. 3.

In FIG. 3, R1 corresponds to the magnetic field detector 402B, R2 corresponds to the fixed resistor 403A, R3 corresponds to the fixed resistor 403B, and R4 corresponds to the magnetic field detector 402A.

Since the magnetic sensor 401 of the present embodiment forms a bridge circuit, it is possible to detect a magnetic field with high precision by a null method, which is independent of variation of a power voltage, input impedance of the detector, or non-linearity.

The structure of the magneto-resistance effect elements (the magnetic field detectors 402A, 402B, and the fixed resistors 403A, 403B) is the same as that described in the first embodiment, and overlapping descriptions are omitted.

In addition, the magnetic sensor 401 shown in FIG. 8 may function as a one-axis magnetic sensor, and three sets of such one-axis magnetic sensors may be combined and appropriately arranged to form a three-axis magnetic sensor, as described in the first embodiment.

Similar to the first embodiment, the magneto-resistance effect elements (the magnetic field detectors 402A, 402B, the fixed resistors 403A, 403B) of the present embodiment are not limited to TMR elements, for example, they can be GMR elements.

According to the present embodiment, since the magnetic field detectors 402A, 402B and the fixed resistors 403A, 403B are arranged in only one groove 405, the area occupied by the magnetic sensor 401 is small, a large number of chips can be cut out from a silicon wafer, and this reduces fabrication cost.

In addition, since the fixed resistors 403A, 403B are also arranged on the inclined surface of the groove 405, temperature properties of the fixed resistors 403A, 403B can be controlled to be similar to that of the magnetic field detectors 402A, 402B, and this make it easy to detect the magnetic field at high precision.

Embodiment 4

In this embodiment, two magnetic field detectors are arranged on two inclined surfaces parallel to each other.

Figure 10:
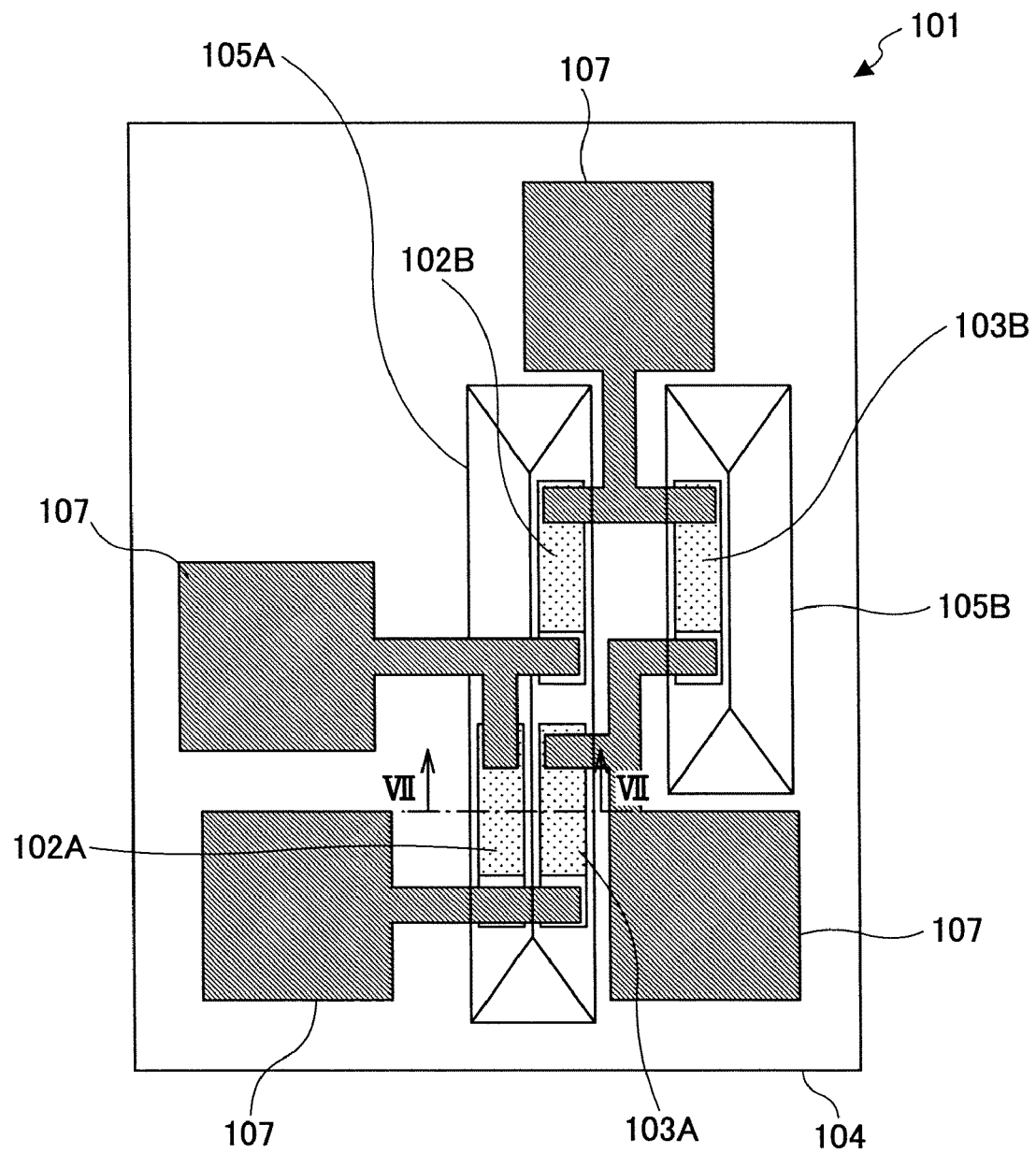
FIG. 10 is a plan view schematically illustrating a configuration of a magnetic sensor according to a fourth embodiment, in which magneto-resistance effect elements are connected to form a bridge circuit.

FIG. 10 is a plan view schematically illustrating a configuration of a magnetic sensor according to a fourth embodiment, in which magneto-resistance effect elements are connected to form a bridge circuit.

As shown in FIG. 10, a magnetic sensor 1 of the present embodiment includes a substrate 104, a magnetic field detector 102A, a magnetic field detector 102B, a fixed resistor 103A, a fixed resistor 103B arranged on the substrate 104, grooves 105A, 105B (collectively referred to as "grooves 105" where necessary), connection wirings 106, and bonding pads 107.

Compared to the first embodiment, positions of the magnetic field detector 102A and the fixed resistor 103A are different the magnetic field detector 2A and the fixed resistor 3A, and as a result, the magnetic field detector 102A and the magnetic field detector 102B are arranged in two different inclined surfaces of the groove 105A.

Here, for example, the magnetic field detectors 102A, 102B, the fixed resistors 103A, 103B are Tunnel Magneto-Resistive (TMR) elements. In addition, the magnetic field detectors 102A, 102B, and the fixed resistors 103A, 103B have the same layer configuration. In each of the fixed resistors 103A, 103B, a magnetic shielding film is provided to reduce sensitivity to external magnetic fields. The magnetic shielding film is described in detail below.

In this embodiment, the substrate 104 of the magnetic sensor 101 is formed from a (100) single crystal silicon wafer. The two grooves 105A and 105B each having a depth of 200 μm are formed in the (100) silicon wafer 410, for example, by etching with a silicon nitride etching mask and KOH (potassium hydroxide) etching liquid or TMAH (Tetramethylammonium hydroxide) etching liquid. Each of the grooves 105A and 105B is formed from four inclined surfaces each having an angle of 55 degrees relative to the surface of the substrate 104.

Figure 11:
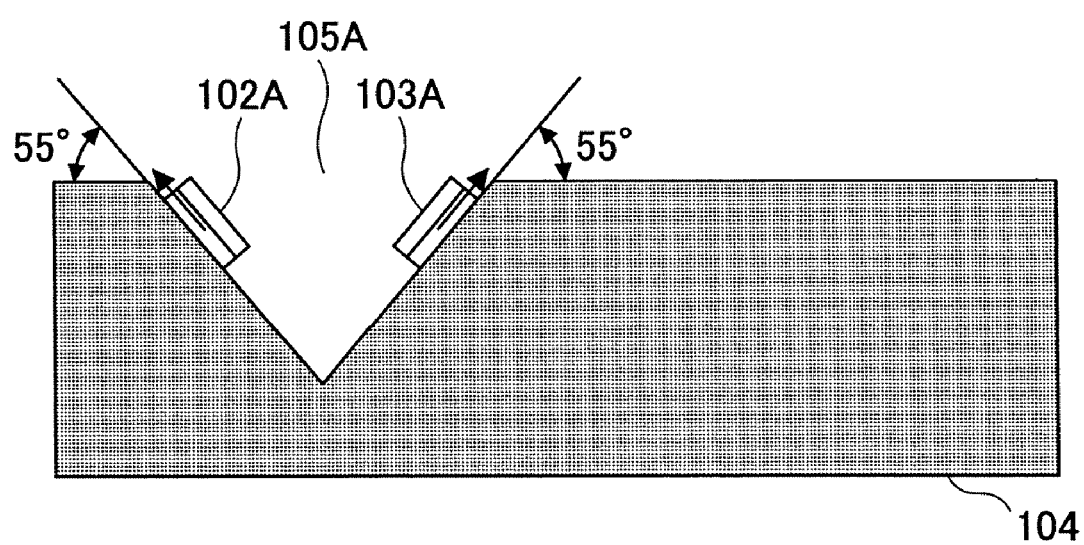
FIG. 11 is a cross-sectional view along a VII-VII line in FIG. 10 for schematically illustrating the magneto-resistance effect elements arranged on the inclined surfaces.

FIG. 11 is a cross-sectional view along a VII-VII line in FIG. 10 for schematically illustrating the magneto-resistance effect elements arranged on the inclined surfaces.

As shown in FIG. 11 and FIG. 10, the magnetic field detectors 102A, 102B, and the fixed resistors 103A, 103B are arranged on the inclined surfaces of the grooves 105A and 105B in the substrate 104 with orientation of magnetization within the inclined surfaces, in addition, the magnetization directions are determined so that magnetization sensing directions are along a depth direction of the inclined surfaces, and intersect with longitudinal directions of the magneto-resistance effect elements (the magnetic field detectors 102A, 102B, and the fixed resistors 103A, 103B).

In this embodiment, as shown in FIG. 11, the grooves 105A and 105B are V-shaped without a flat bottom approximately parallel to the surface of the substrate 104. Certainly, the bottom surfaces of the grooves 105A and 105B can have other shapes.

As shown in FIG. 10, the magnetic field detectors 102A, 102B and the fixed resistors 103A, 103B are connected through the connection wirings 106 to constitute a bridge circuit, and are connected to the bonding pads 107, which serve as input and output terminals. The connection wirings 106 are arranged in the space between the grooves 105A, 105B.

In addition, besides the (100) single crystal silicon wafer, the substrate 104 of the magnetic sensor 101 may also be formed from a (110) silicon wafer, semiconductors other than silicon, glass materials, ceramic materials, non-magnetic metals, and others.

When the (100) silicon wafer is used for the substrate 104, because a (111) crystal plane inclined by an angle of 55 degrees relative to the surface of the substrate 101 can be stably formed by anisotropic wet etching using KOH or other etching liquid, the positional relation of the magnetic field detectors 2A, 2B on two inclined surfaces parallel to each other is constant; thus fabrication reproducibility is good, and fabrication yield is high. Hence, in this embodiment, it is preferable to use the (100) silicon wafer for the substrate 104.

Below, the bridge circuit constituted by the magnetic field detectors 102A, 102B, and the fixed resistors 103A, 103B is described with reference to FIG. 12.

Figure 12:
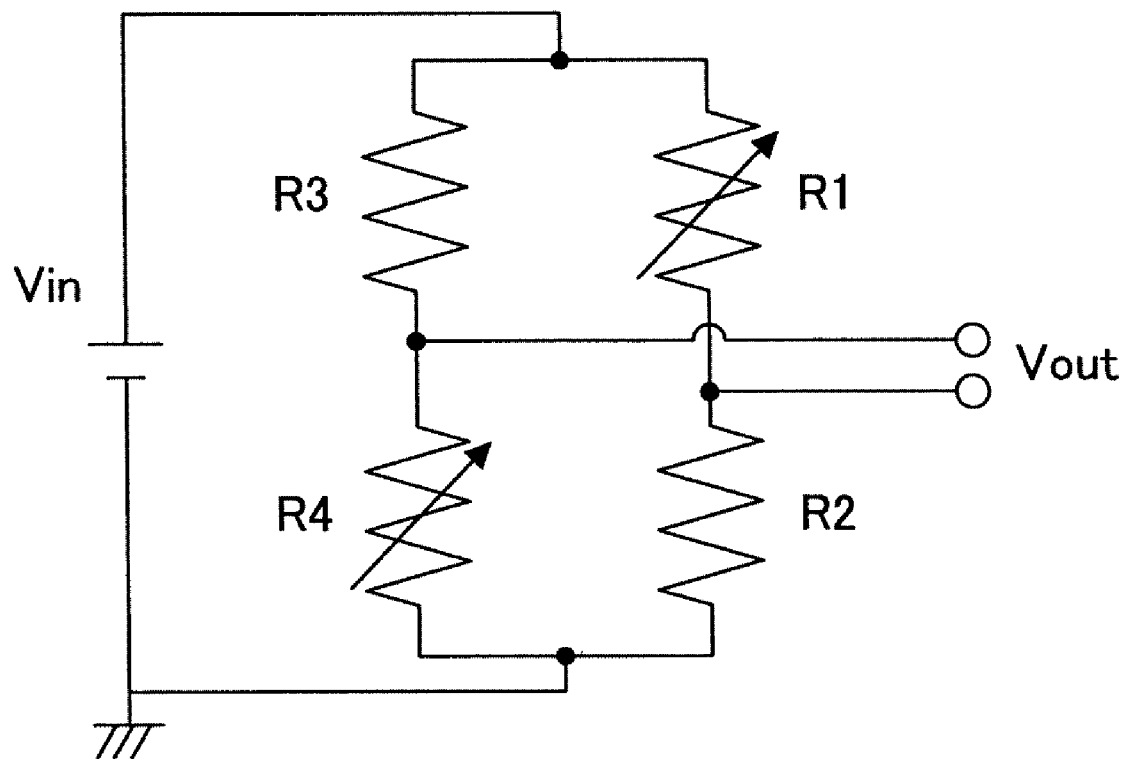
FIG. 12 is a circuit diagram illustrating a bridge circuit.

FIG. 12 is a circuit diagram illustrating a bridge circuit.

In this embodiment, as shown in FIG. 10, the magnetic field detectors 2A, 2B are arranged on different inclined surface parallel to each other, while the fixed resistors 103A, 103B are arranged on two inclined surfaces different from the inclined surfaces where the magnetic field detectors 102A, 102B are arranged. The magnetic field detectors 102A, 102B and the fixed resistors 103A, 103B constitute resistance R1, R2, R3, R4 of the bridge circuit shown in FIG. 12.

In FIG. 12, R1 corresponds to the magnetic field detector 102B, R2 corresponds to the fixed resistor 103A, R3 corresponds to the fixed resistor 103B, and R4 corresponds to the magnetic field detector 102A.

Since the magnetic sensor 101 of the present embodiment forms a bridge circuit, it is possible to detect a magnetic field with high precision by a null method, which is independent of variation of a power voltage, input impedance of the detector, or non-linearity.

The structure of the magneto-resistance effect elements (the magnetic field detectors 102A, 102B, the fixed resistors 103A, 103B) is the same as that described in the first embodiment, and overlapping descriptions are omitted.

Note that in the present embodiment, the magneto-resistance effect elements are not limited to TMR elements, for example, they can be GMR elements.

Figure 13:
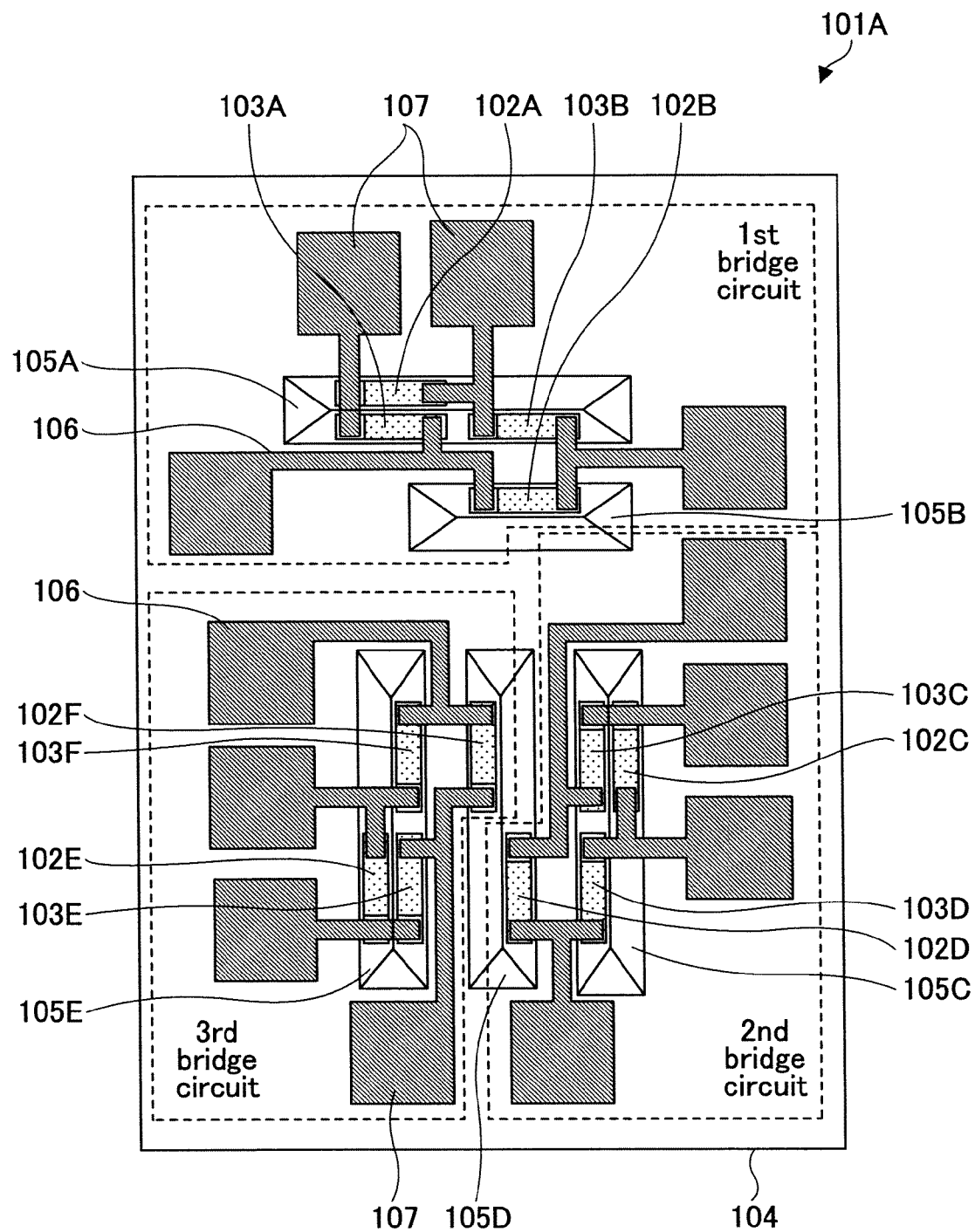
FIG. 13 is a plan view schematically illustrating a configuration of a three-axis magnetic sensor according to the present embodiment, which includes three sets of one-axis magnetic sensors.

FIG. 13 is a plan view schematically illustrating a configuration of a three-axis magnetic sensor according to the present embodiment, which includes three sets of one-axis magnetic sensors.

As shown in FIG. 13, a three-axis magnetic sensor 101A of the present embodiment includes a substrate 104, six magnetic field detectors 102A, 102B, 102C, 102D, 102E, 102F (collectively referred to as "magnetic field detectors 102" where necessary), six fixed resistors 103A, 103B, 103C, 103D, 103E, 103F (collectively referred to as "fixed resistors 103" where necessary), five grooves 105A, 105B, 105C, 105D, 105E, twelve bonding pads 107, and connection wirings 106 for electrical connection between the magnetic field detectors 102A, 102B, 102C, 102D, 102E, 102F and the fixed resistors 103A, 103B, 103C, 103D, 103E, 103F.

The magnetic field detectors 102A, 102B, 102C, 102D, 102E, 102F and the fixed resistors 103A, 103B, 103C, 103D, 103E, 103F are Tunnel Magneto-Resistive (TMR) elements, and have the same layer configuration.

The substrate 104 of the three-axis magnetic sensor 101A is formed from a (100) silicon wafer. The five grooves 105A, 105B, 105C, 105D, 105E each having a depth of 200 μm are formed in the (100) silicon wafer 104, for example, by etching with a silicon nitride etching mask and KOH (potassium hydroxide) etching liquid or TMAH (Tetramethylammonium hydroxide) etching liquid. Each of the grooves 105A, 105B, 105C, 105D, 105E is formed from four inclined surfaces each having an angle of 55 degrees relative to the surface of the substrate 104.

The magnetic field detectors magnetic field detectors 102A, 102B, 102C, 102D, 102E, 102F and the fixed resistors 103A, 103B, 103C, 103D, 103E, 103F are arranged on the inclined surfaces of the grooves 105A, 105B, 105C, 105D, 105E in the substrate 104 with orientation of magnetization within the inclined surfaces, in addition, the magnetization directions are determined so that magnetization sensing directions are is along a depth direction of the inclined surfaces, and intersect with longitudinal directions of the magneto-resistance effect elements (the magnetic field detectors 102A, 102B, 102C, 102D, 102E, 102F and the fixed resistors 103A, 103B, 103C, 103D, 103E, 103F).

In this embodiment, the bottom surfaces of the grooves 105A, 105B, 105C, 105D, 105E are V-shaped without a flat bottom approximately parallel to the surface of the substrate 104. Certainly, the bottom surfaces of the grooves 105A, 105B, 105C, 105D, 105E can have other shapes.

In the three-axis magnetic sensor 1A shown in FIG. 13, the magnetic field detectors 102A, 102B function as a one-axis magnetic sensor adapted to a first axis direction, and form a first bridge circuit in combination with the fixed resistors 103A, 103B.

The magnetic field detectors 102C, 102D function as a one-axis magnetic sensor adapted to a second axis direction, and form a second bridge circuit in combination with the fixed resistors 103C, 103D.

The magnetic field detectors 102E, 102F function as a one-axis magnetic sensor adapted to a third axis direction, and form a third bridge circuit in combination with the fixed resistors 103E, 103F.

Magnetization directions of pinned layers 22 (as shown in FIG. 4B) in the magnetic field detectors 102A, 102B, 102C, 102D, 102E, 102F are different from each other in the three one-axis magnetic sensors formed from the first bridge circuit, the second bridge circuit, and the third bridge circuit, respectively. Specifically, magnetization directions of the pinned layers in the X-axis and the Z-axis are perpendicular to each other in the paper, and the magnetization directions of the pinned layers in the X-axis and the Y-axis are anti-parallel to each other in the paper. Namely, the magnetization directions of the pinned layers in the X-axis, Y-axis, and the Z-axis sterically radiate in three directions at 55 degrees relative to the surface of the substrate.

It should be noted that arrangement of the magnetic field detectors 102A, 102B, 102C, 102D, 102E, 102F and the fixed resistors 103A, 103B, 103C, 103D, 103E, 103F is not limited to the above embodiment as long as the magnetization directions of the pinned layers in the X-axis, Y-axis, and the Z-axis are different from each other.

Embodiment 5

In this embodiment, a magnetic shielding film provided to reduce sensitivity of the fixed resistors to external magnetic fields is primarily described.

Figure 14:
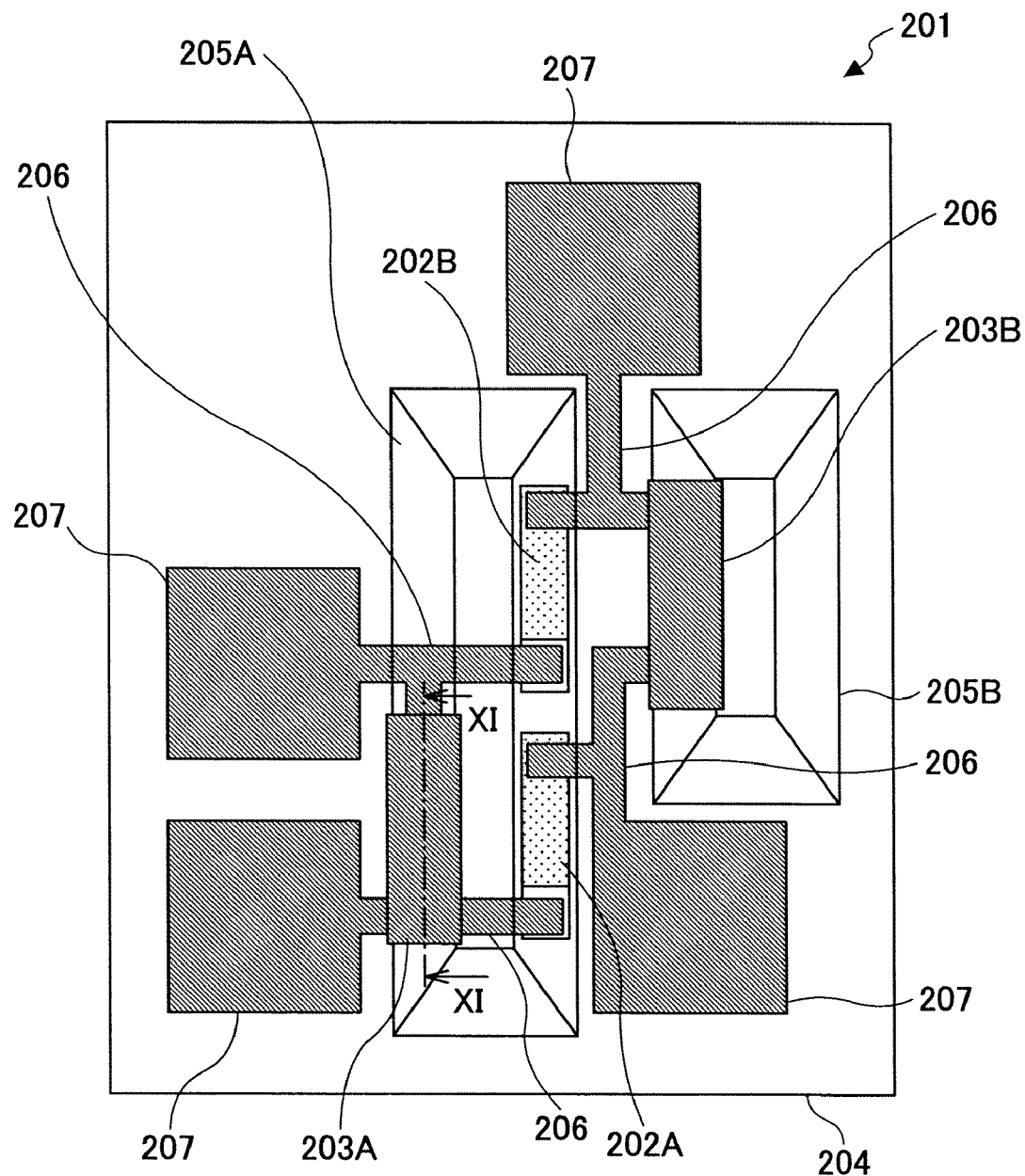
FIG. 14 is a plan view schematically illustrating a configuration of a magnetic sensor according to a fifth embodiment, in which a magnetic shielding film is provided for the fixed resistors.

FIG. 14 is a plan view schematically illustrating a configuration of a magnetic sensor according to a fifth embodiment, in which a magnetic shielding film is provided for the fixed resistors.

Note that the basic structure of the magnetic sensor of the present embodiment is the same as that in the first embodiment except for the magnetic shielding film. In addition, the basic structure of the magnetic sensor of the present embodiment can be replaced with the magnetic sensors of the second to fourth embodiments.

As shown in FIG. 14, a magnetic sensor 201 of the present embodiment includes a substrate 204, a magnetic field detector 202A, a magnetic field detector 202B, a fixed resistor 203A, a fixed resistor 203B arranged on the substrate 204, grooves 205A, 205B (collectively referred to as "grooves 205" where necessary), connection wirings 206, and bonding pads 207.

For example, the magnetic field detectors 202A, 202B, the fixed resistors 203A, 203B are Tunnel Magneto-Resistive (TMR) elements. In addition, the magnetic field detectors 202A, 202B, and the fixed resistors 203A, 203B have the same layer configuration. A magnetic shielding film is formed on each of the fixed resistors 203A, 203B with an insulating thin film in between to reduce sensitivity to external magnetic fields.

Figure 15:
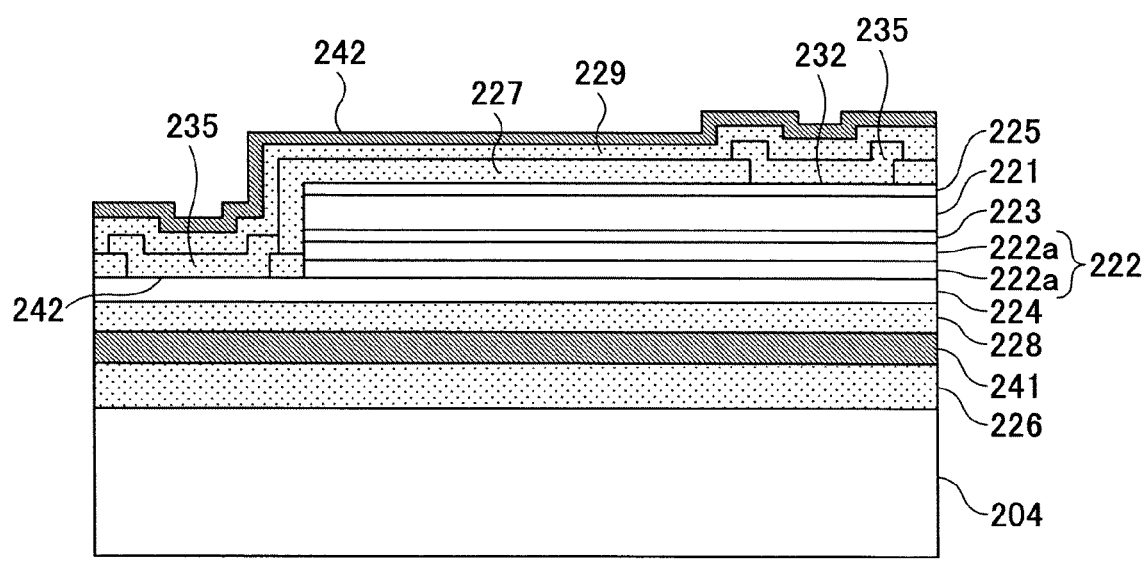
FIG. 15 is a cross-sectional view along a XI-XI line in FIG. 14 for illustrating a configuration of the magneto-resistance effect element, specifically, the TMR element of the present embodiment with the fixed resistor 203A as an example.

FIG. 15 is a cross-sectional view along a XI-XI line in FIG. 14 for illustrating a configuration of the magneto-resistance effect element, specifically, the TMR element of the present embodiment with the fixed resistor 203A as an example.

The structure shown in FIG. 15 is basically the same as that shown in FIG. 4B, except that the magnetic shielding film is additionally formed on the fixed resistors.

As shown in FIG. 15, the fixed resistor 203A includes a free layer 221, a pinned layer 222, an insulating layer 223, an electrode 224 on the side of the pinned layer 222, and a cap layer 225, a wiring electrode 235, a lower magnetic shielding film 241, an upper magnetic shielding film 242, insulating thin films 228, 229 for securing insulation between the lower magnetic shielding film 241, the upper magnetic shielding film 242 and the electrodes 224, 235, an insulating thin film 226 for securing insulation with the substrate 204, and a passivation film 227.

A pinned-layer-side contact hole 231 and a free-layer-side contact hole 232 are formed in the passivation film 227 for bonding the electrode 224 and the cap layer 225 with the wiring electrode 235, and wirings (not illustrated) for electrical connection are arranged through the contact hole 231 and the contact hole 232.

The free layer 221 has a magnetization direction changing in response to the direction of the external magnetic field, whereas the pinned layer 222 has a fixed magnetization direction, which does not change depending on the direction of the external magnetic field.

The insulating layer 223 is sandwiched by the free layer 221 and the pinned layer 222, and functions as a tunneling layer.

Since the free layer 221 is covered by the magnetic shielding film 241 and the upper magnetic shielding film 242, the free layer 221 is insensitive to the external magnetic field.

In the fixed resistor 203A, which is a TMR element, the pinned layer 222 deposited on the substrate 204 may include an antiferromagnetic layer 222a, like Fe—Ni, and a magnetic layer 222b, like Co—Fe. The insulating layer 223 is deposited on the pinned layer 222, and the free layer 221 is further deposited on the insulating layer 223.

For example, the insulating layer 223 may be formed from insulating materials like SiO2, or non-magnetic oxide of metal, like Al2O3, or MgO, and the free layer 221 may be formed from Co—Fe, or Fe—Ni.

Note that in the present embodiment, the magneto-resistance effect element is not limited to a TMR element, for example, it can be a GMR element.

According to the present embodiment, the magnetic field detector 202A, the magnetic field detector 202B, and the fixed resistor 203A, the fixed resistor 203B, which form a sensor bridge circuit, are formed from the same material and have the same layer structure, and only the fixed resistors 203A, 203B are covered by the magnetic shielding film with an insulating thin film in between. Therefore, the magnetic field detector 202A, the magnetic field detector 202B, and the fixed resistor 203A, the fixed resistor 203B have the same temperature characteristics, and characteristics fluctuation caused by the temperature can be reduced.

Below, a method of producing the magnetic sensor 201 of the present embodiment, especially, the magneto-resistance effect element used in the magnetic sensor 201.

Figure 16:
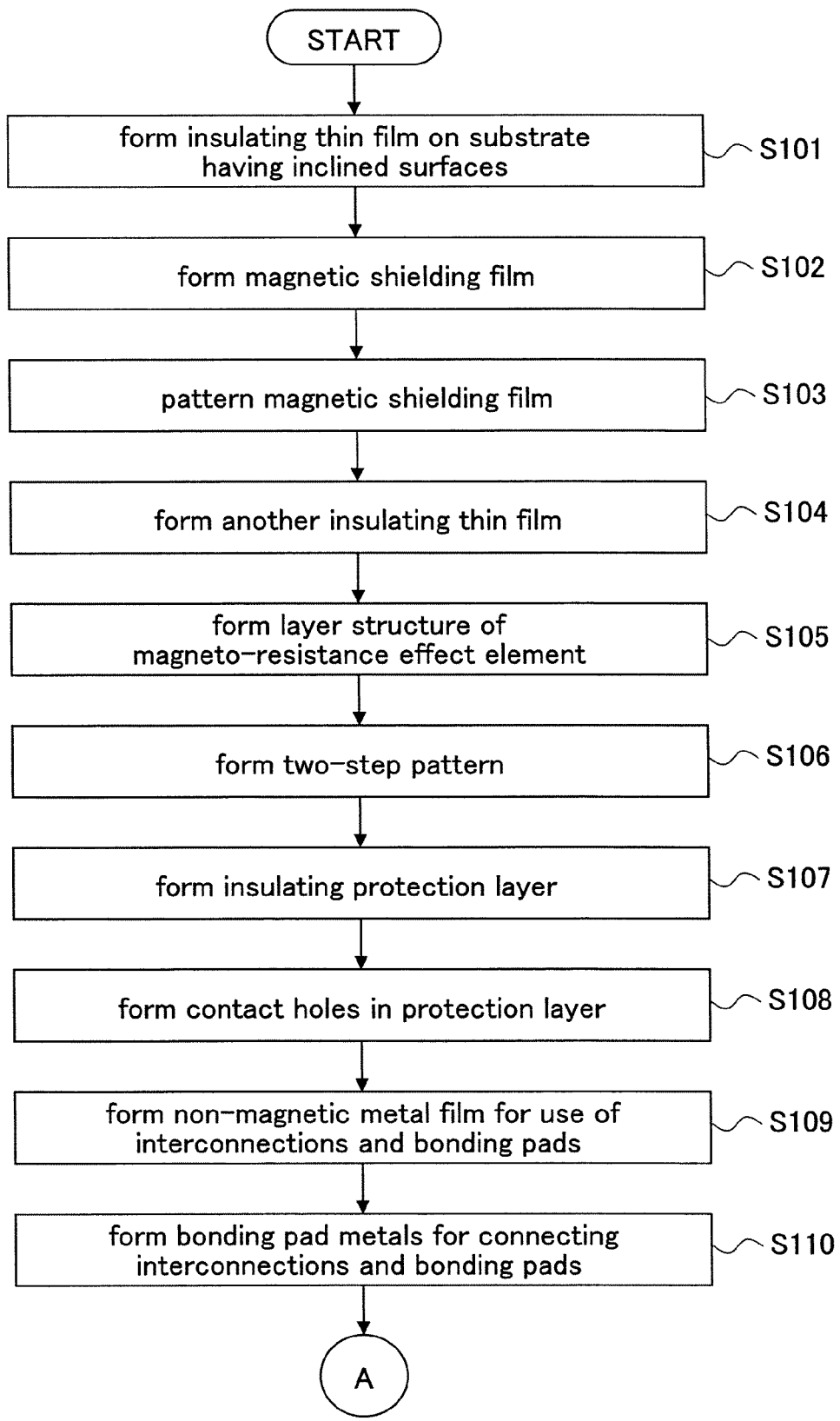
FIG. 16 is a flowchart illustrating a method of producing the magnetic sensor 201 of the present embodiment.

FIG. 16 is a flow chart illustrating a method of producing the magnetic sensor 201 of the present embodiment.

Below, it is assumed that desired inclined surfaces have been formed on the substrate in advance.

As shown in FIG. 16, in step S101, an insulating thin film is formed from, for example, silicon oxide, on the substrate having the inclined surfaces.

In step S102, a magnetic shielding film is formed from, for example, a Ni—Fe alloy film, a Si—Fe alloy film, or a Fe—Ni—Mn—Cu alloy film.

In step S103, photolithography and etching are performed on the magnetic shielding film to remove portions of the magnetic shielding film near the position where the magnetic field detectors are to be arranged.

In step S104, another insulating thin film is formed from silicon oxide.

In step S105, layers of the layer structure constituting the magneto-resistance effect element used in the magnetic sensor 201 are formed sequentially.

In step S106, photolithography and etching are performed twice on the layers formed so far to form a two-step pattern.

In step S107, an insulating protection layer is formed on the patterned structure.

In step S108, photolithography and etching are performed on the protection layer to form contact holes.

In step S109, a non-magnetic metal film for use of interconnections and bonding pads is formed on the whole surface of the substrate to cover the contact hole.

In step S110, photolithography and etching are performed to form bonding pad metal for connecting interconnections among the contact holes and input/output terminals.

FIG. 17 is a flow chart, continuing from the flow chart in FIG. 16, illustrating the method of producing the magnetic sensor 201 of the present embodiment.

As shown in FIG. 17, in step S111, another insulating thin film is formed from, for example, silicon oxide.

In step S112, a magnetic shielding film is formed on the insulating thin film formed in step S111 on the surface of the substrate, where the magneto-resistance effect element is formed, from a Ni—Fe alloy film, a Si—Fe alloy film, or a Fe—Ni—Mn—Cu alloy film.

In step S113, photolithography and etching are performed to pattern the magnetic shielding film so that a portion of the magnetic shielding film remains to cover the fixed resistor 3A and the fixed resistor 3B, and other portions of the magnetic shielding film are removed.

In step S114, photolithography and etching are performed to remove the insulating thin film formed on bonding pad metal.

In step S115, annealing is performed in a magnetic field to fix the direction of the pinned layer.

In this step, the direction of applying the magnetic field is set to be perpendicular to the surface of the substrate. When the magnetic sensor 201 is to be used as a one-axis sensor, the direction of applying the magnetic field may be different from the direction perpendicular to the inclined surface of the substrate.

In step S116, after the direction of the pinned layer is fixed, annealing is performed again in a magnetic field at a temperature lower than that in step S115 to fix the direction of the free layer.

In this step, the direction of applying the magnetic field is set to be parallel to the surface of the substrate. Since the direction of the pinned layer is fixed in step S115, the direction of the pinned layer is not changed in step S116.

In this way, the magnetic field in the perpendicular direction is applied on the surface of the substrate while heating the whole substrate to magnetize (namely, to fix the magnetization direction) the pinned layer of the magnetic field detector formed from the magneto-resistance effect element, it is possible to complete magnetization of the magnetic field detector through only one magnetization step.

In the above embodiments, it is described that a (100) single crystal silicon wafer is used to form the substrates 4, 104, 204, 304, 404 of the magnetic sensor of the present invention, the grooves 5, 105, 205, 305, 405 are formed from four inclined surfaces each having an angle of 55 degrees relative to the surface of the substrate, but, the present invention is not limited to this. The angle of the inclined surfaces can be any angle except the horizontal angle, and instead of the grooves, projections are also applicable to the present invention.

Further, in addition to the (100) silicon wafer, the substrate of the magnetic sensor may also be formed from a (110) silicon wafer, semiconductors other than silicon, glass materials, ceramic materials, non-magnetic metals, and others. When the (100) silicon wafer is used, the crystal orientation plane is at 54.7 (approximately 55) degrees, and this is preferable in the present invention.

According to the above embodiments, the substrate has plural inclined surfaces which have normal directions intersecting with each other in a three-dimensional manner, and the pair of the magnetic field detectors in each of the sensor bridge circuits is arranged in the same inclined surface.

In addition, when the substrate is formed from a (100) silicon wafer, and has plural inclined surfaces of normal directions intersecting with each other in a three-dimensional manner, each of the inclined surfaces being a (111) orientation crystal plane forming an angle of 55 degrees relative to a surface of the substrate, and the pair of the magnetic field detectors in each of the sensor bridge circuits is arranged in the same inclined surface.

Alternatively, when the substrate has plural inclined surfaces which have normal directions intersecting with each other in a three-dimensional manner, the magnetic field detectors in each of the first sensor bridge circuit, the second sensor bridge circuit, and the third sensor bridge circuit are arranged in the inclined surfaces having normal directions intersecting with each other in a three-dimensional manner, and the pair of the magnetic field detectors in the same one of the first sensor bridge circuit, the second sensor bridge circuit, and the third sensor bridge circuit is arranged in the inclined surfaces having the same normal direction.

When the substrate is formed from a (100) single crystal silicon wafer, and has plural inclined surfaces of normal directions intersecting with each other in a three-dimensional manner, each of the inclined surfaces being a (111) orientation crystal plane forming an angle of 55 degrees relative to a surface of the substrate, the magnetic field detectors in each of the first sensor bridge circuit, the second sensor bridge circuit, and the third sensor bridge circuit are arranged in the inclined surfaces having normal directions intersecting with each other in a three-dimensional manner, and the pair of the magnetic field detectors in the same one of the first sensor bridge circuit, the second sensor bridge circuit, and the third sensor bridge circuit are arranged in the inclined surfaces having the same normal direction.

As a result, by applying a magnetic field in one direction while heating the substrate in the magnetic field only once, it is possible to magnetize the pinned layers of the magnetic field detectors in one direction, and it is possible to realize magnetization in three magnetization directions, in which magnetization directions of the pinned layers in different coordinate systems intersect with each other in a three-dimensional manner. Therefore, it is possible to reduce the number of fabrication steps, and improve fabrication yields. In addition, since the integral mounting on the substrate is possible, the magnetic sensor can be made small and thin, and a large number of the magnetic sensors can be fabricated; that is, productivity is improved.

Since the inclined surfaces, on which the magnetic sensors are arranged, may be defined by crystal planes, position precisions of the magnetic sensors in different axial directions are very high, positional relation of the three axial directions is uniquely defined by positional relation of the crystal planes; therefore, it is possible to fabricate the magnetic sensor with little fluctuations.

In addition, since each of the fixed resistors is covered by a magnetic shielding member with an insulating member of electrical insulation in between, the fixed resistors have constant resistance without being influenced by an external magnetic field even when the magnetic sensor is sensitive to the external magnetic field of a magneto-resistance effect element. In addition, since each of the fixed resistors includes a magneto-resistance effect element formed from the same layer configuration as the magnetic field detectors, the magnetic sensor has uniform temperature characteristics, and thus stable performance.

Since the magneto-resistance effect element includes a tunnel magneto-resistance effect element, it is possible to reduce power consumption in magnetic detection.

Since magnetization (namely, fixing the magnetization direction) of the pinned layers of the magnetic field detectors formed from a magneto-resistance effect element can be performed by applying a magnetic field in a direction perpendicular on a surface of the substrate while heating the substrate, it is possible to complete magnetization of the magnetic field detectors in one magnetization step.

The present invention can be used in a device using GPS, such as a car-navigation system or a mobile phone, for confirmation of a current location in an area where electro-magnetic signals are shielded.

While the present invention is described with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Applications No. 2007-156423 filed on Jun. 13, 2007, and No. 2008-108061 filed on Apr. 17, 2008, the entire contents of which are hereby incorporated by reference.

What is claimed is:

1. A magnetic sensor, comprising:
    a substrate; and
    a plurality of sensor bridge circuits each including a pair of magnetic field detectors and a pair of fixed resistors arranged on the substrate, the pair of the magnetic field detectors and the pair of the fixed resistors being connected to form a bridge circuit, each of the magnetic field detectors being formed of a magneto-resistance effect element, and magnetization directions of the magnetic field detectors intersect with each other in a three-dimensional manner,
    wherein
    the substrate has a plurality of inclined surfaces, and normal directions of the inclined surfaces intersect with each other in a three-dimensional manner,
    the pair of the magnetic field detectors in each of the sensor bridge circuits is arranged on the same inclined surface, and
    each one of the pair of fixed resistors in each of the sensor bridge circuits is respectively arranged on a different one of two inclined surfaces which are parallel to each other and different from the inclined surface on which the magnetic field detectors in the respective sensor bridge circuit are arranged.

2. The magnetic sensor as claimed in claim 1, wherein
    the substrate is formed of a (100) single crystal silicon wafer, and has a plurality of inclined surfaces of normal directions intersecting with each other in a three-dimensional manner, each of the inclined surfaces being a (111) orientation crystal plane forming an angle of 55 degrees relative to a surface of the substrate.

3. The magnetic sensor as claimed in claim 1, wherein each of the fixed resistors includes a magneto-resistance effect element formed of the same layer configuration as the magnetic field detectors, and is covered by a magnetic shielding member with an insulating member of electrical insulation in between.

4. The magnetic sensor as claimed in claim 1, wherein the magneto-resistance effect element includes a tunnel magneto-resistance effect element.

5. A magnetic sensor, comprising:
   a substrate; and
   a first sensor bridge circuit, a second sensor bridge circuit, and a third sensor bridge circuit, each of the first sensor bridge circuit, the second sensor bridge circuit, and the third sensor bridge circuit including a pair of magnetic field detectors and a pair of fixed resistors arranged on the substrate and connected to form a bridge circuit, each of the magnetic field detectors being formed of a magneto-resistance effect element, each of the fixed resistors having a constant resistance value not influenced by an external magnetic field, and magnetization directions of the magnetic field detectors intersect with each other in a three-dimensional manner,
   wherein
   the substrate has a plurality of inclined surfaces, and normal directions of the inclined surfaces intersect with each other in a three-dimensional manner, and
   the magnetic field detectors in each of the first sensor bridge circuit, the second sensor bridge circuit, and the third sensor bridge circuit are arranged on the inclined surfaces having normal directions intersecting with each other in a three-dimensional manner, and
   the pair of the magnetic field detectors in a same one of the first sensor bridge circuit, the second sensor bridge circuit, and the third sensor bridge circuit is arranged on an inclined surface having the same normal direction, and
   each one of the pair of fixed resistors in each of the sensor bridge circuits is respectively arranged on a different one of two inclined surfaces which are parallel to each other and different from the inclined surface on which the magnetic field detectors in the respective sensor bridge circuit are arranged.

6. The magnetic sensor as claimed in claim 5, wherein the substrate is formed of a (100) single crystal silicon wafer, and has a plurality of inclined surfaces of normal directions intersecting with each other in a three-dimensional manner, each of the inclined surfaces being a (111) orientation crystal plane forming an angle of 55 degrees relative to a surface of the substrate.

7. The magnetic sensor as claimed in claim 5, wherein each of the fixed resistors includes a magneto-resistance effect element formed of the same layer configuration as the magnetic field detectors, and is covered by a magnetic shielding member with an insulating member of electrical insulation in between.

8. The magnetic sensor as claimed in claim 5, wherein the magneto-resistance effect element includes a tunnel magneto-resistance effect element.

* * * * *